(12) United States Patent
Mikami et al.

(10) Patent No.: US 6,344,991 B1
(45) Date of Patent: Feb. 5, 2002

(54) NONVOLATILE SEMICONDUCTOR MEMORY DEVICE

(75) Inventors: Noboru Mikami; Takeharu Kuroiwa, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/741,797

(22) Filed: Dec. 22, 2000

(30) Foreign Application Priority Data

Jul. 27, 2000 (JP) .......................................... 12-226803

(51) Int. Cl.⁷ .............................................. G11C 11/22
(52) U.S. Cl. ....................................... 365/145; 365/117
(58) Field of Search ................................. 365/145, 117, 365/149, 148, 185.01; 257/295

(56) References Cited

U.S. PATENT DOCUMENTS 5,341,325 A * 8/1994 Nakano
5,495,438 A 2/1996 Omura ........................ 365/145
5,579,258 A * 11/1996 Adachi ........................ 365/145
6,151,241 A * 11/2000 Hayashi ....................... 365/145

FOREIGN PATENT DOCUMENTS

| JP | 5-259391 | 10/1993 |
| JP | 7-14380 | 1/1995 |

* cited by examiner

*Primary Examiner*—A. Zarabian
(74) *Attorney, Agent, or Firm*—McDermott, Will & Emery

(57) ABSTRACT

The inventive nonvolatile semiconductor memory device, rewriting stored information with the quantity of charges of a dielectric material, comprises a ferroelectric film having a hysteresis characteristic in a dependency of an electric field density and an-electric field and a nonlinear element electrically connected with the ferroelectric film. In this nonlinear element, the quantity of increase of a positive electric flux density with respect to an electric field is small in a low field region and large in a high field region in a dependency of the electric flux density and the electric field. Thus, it is possible to obtain a nonvolatile semiconductor memory device capable of suppressing dispersion in coercive filed and preventing reduction of voltage resistance without increasing the chip area.

10 Claims, 37 Drawing Sheets

WRITE VOLTAGE FOR P11 WRITING

WRITE VOLTAGE FOR P10 WRITING

WRITE VOLTAGE FOR P00 WRITING

WRITE VOLTAGE FOR P01 WRITING

Pr: RESIDUAL POLARIZATION

NONVOLATILE SEMICONDUCTOR MEMORY DEVICE

BACKGROUND OF THE INVENTION

1. Field of the Invention

The present invention relates to a nonvolatile semiconductor memory device, and more specifically, it relates to a nonvolatile semiconductor memory device rewriting stored information by polarization reversal of a ferroelectric material.

2. Description of the Prior Art

A nonvolatile ferroelectric memory rewriting stored information by polarization reversal of a ferroelectric material is generally referred to as an FRAM (ferroelectric random access memory). Memory cells of such an FRAM are roughly classifiable into two types of structures.

In the first structure of a DRAM (dynamic random access memory) type, charges are stored in a storage capacitor as information. In this structure, memory cells formed by ferroelectric capacitors and switching transistors are arranged in the form of a matrix for performing addressing with a bit line and a word line connected to each transistor and detecting charges following inversion of polarization as shown in FIG. 65. The operation principle of an FRAM memory cell having such a structure is as follows:

As shown in FIG. 66, the relation between a polarization value B of the ferroelectric capacitor and an applied voltage V draws a hysteresis loop. In a nonvolatile operation, information is stored in points A and B of two states under an applied voltage "0 V". It is assumed here that the polarization state of the storage capacitor is at the point A. The polarization value moves to a point C when applying 5 V and 0 V to a plate line and the bit line respectively, and returns to the point A when returning the applied voltage to 0 V. However, the polarization value moves to a point D due to polarization inversion when applying 0 V and 5 V to the plate line and the bit line respectively, and moves to the point B after returning the applied voltage to 0 V. This indicates that the stored information is rewritten from the point A to the point B. Thus, the storage state can be rewritten by changing the voltages applied to the plate line and the bit line for externally determining the stored information as a polarization current.

In the second structure of an FET (field-effect transistor) type, a silicon oxide film forming a gate insulator film of a general MOS (metal oxide semiconductor) FET is replaced with a ferroelectric film as shown in FIG. 67, and this structure is referred to as an MFSFET. An MFSMISFET type memory cell formed by inserting a floating gate between a gate electrode and a channel as shown in FIG. 68 is also proposed as a modification of this structure.

In each of the first and second structures, a single type of ferroelectric material is generally employed for the FRAM.

When the stored information is rewritten a number of times in the FRAM, however, a hysteresis characteristic is deteriorated to educe the quantity of read charges. Further, dispersion of hysteresis characteristics of ferroelectric capacitors in large-scale memory cells, particularly dispersion in coercive filed results in write and read failures. Thus, the FRAM has such disadvantages that stable operations of writing and reading stored information cannot be attained, the FRAM must be driven with a sufficient write voltage, and a drive time and a drive voltage are limited.

FIG. 69 shows memory cells of a 2T2C system provided for overcoming such disadvantages. In the 2T2C system, complementary signals from two memory cells in which data are complementarily written are input as two differential inputs in a sense amplifier for detecting the data. Therefore, two storage capacitors of a single memory cell are subjected to writing by the same number of times, and hence ferroelectric films are equally deteriorated to enable stable operations. In this case, however, the memory cell area is doubled to disadvantageously increase the chip area.

In order to prevent dispersion in coercive filed, the thickness of ferroelectric films may be reduced. In this case, however, voltage resistance across electrodes is reduced to disadvantageously cause dielectric breakdown.

While a single ferroelectric film is generally held between a pair of electrodes in the structure of a ferroelectric capacitor, a multilayer structure of a ferroelectric film and another film may be held between a pair of electrodes as follows:

When a ferroelectric film directly comes into contact with a silicon substrate in an FET type memory cell, it is difficult to stably operate a transistor due to occurrence of a trap level or formation of a dielectric material such as $SiO_2$ on the surface of the silicon substrate. Therefore, a multilayer structure of a dielectric film and a ferroelectric film may be employed on a silicon substrate. In this case, however, the dielectric film is a paraelectric material operating as a capacitor having no hysteresis characteristic, and does not overcome the aforementioned disadvantages such as dispersion in coercive filed.

For example, Japanese Patent Laying-Open No. 5-259391 (1993) discloses a structure obtained by stacking ferroelectric films. This gazette shows a structure obtained by stacking three ferroelectric films 103a, 103b and 103c between a bottom electrode 102 and a top electrode 104, as shown in FIG. 70. While the aforementioned gazette states that random defects of thin films are effectively reduced due to the multilayer structure of the ferroelectric films 103a, 103b and 103c, this structure does not overcome the aforementioned disadvantages such as dispersion in coercive filed.

Japanese Patent Laying-Open No. 7-14380 (1995) shows a structure obtained by connecting a ferroelectric capacitor 110 formed by a pair of electrodes 111 and 113 and a ferroelectric film 112 in parallel or series with a ferroelectric capacitor 120 formed by a pair of electrodes 121 and 123 and a ferroelectric film 122, as shown in FIGS. 71A or 71B. While the aforementioned gazette states that a composite hysteresis characteristic shown in FIG. 72 is obtained due to this structure thereby implementing nondestructive reading and avoiding characteristic deterioration, this structure does not overcome the aforementioned disadvantages such as dispersion in coercive filed either.

Japanese Patent Laying-Open No. 7-14380 also states that three values can be stored by adjusting hysteresis characteristics of two ferroelectric films and obtaining a composite hysteresis characteristic shown in FIG. 73.

SUMMARY OF THE INVENTION

An object of the present invention is to provide a nonvolatile semiconductor memory device capable of suppressing dispersion in coercive filed and preventing reduction of voltage resistance without increasing the chip area.

Another object of the present invention is to provide a nonvolatile semiconductor memory device storing at least four values by changing a drive system for memory cells dissimilarly to the system described in Japanese Patent Laying-Open No. 7-14380.

According to the present invention, a nonvolatile semiconductor memory device rewriting stored information with a quantity of charges of a dielectric material comprises a ferroelectric film having a hysteresis characteristic in a dependency of an electric flux density D and an electric field E and a nonlinear element electrically connected with the ferroelectric film and having at least either such a characteristic that the quantity of increase of a positive electric flux density D with respect to the electric field E is small in a low electric field region and large in a high electric field region in the dependency of the electric field density D and the electric field E or such a characteristic that the quantity of increase of a positive current I is small in a low electric field or low voltage region and large in a high electric field or high voltage region in a dependency of the current I and the electric field E or an applied voltage V.

According to the inventive nonvolatile semiconductor memory device, the nonlinear element has a small quantity of increase of the positive electric flux density D with respect to the electric field E in the low field region and hence an electric field acting on the ferroelectric film is small and suppresses polarization inversion of the ferroelectric film in the low field region. In the high field region, on the other hand, the nonlinear element has a large quantity of increase of the electric flux density D with respect to the electric field E and hence the electric field acting on the ferroelectric film abruptly increases and prompts polarization inversion of the ferroelectric film in the high field region. Thus, polarization inversion of the ferroelectric film is abruptly prompted in the high field region and hence, also when the ferroelectric film is dispersed in coercive filed, the nonlinear element suppresses such dispersion for stabilizing a read/write operation of a memory cell.

The nonlinear element has a small quantity of increase of the positive current I with respect to the electric field E or the applied voltage V in the low field or low voltage region and hence an electric field or a voltage acting on the ferroelectric film is small and suppresses polarization inversion of the ferroelectric film in the low field or low voltage region. In the high field or high voltage region, on the other hand, the nonlinear element has a large quantity of increase of the current I with respect to the electric field E or the applied voltage V and hence the current I flowing in the ferroelectric film abruptly increases and prompts polarization inversion of the ferroelectric film in the high field or high voltage region. Thus, polarization inversion of the ferroelectric film is abruptly prompted in the high field or high voltage region and hence, also when the ferroelectric film is dispersed in coercive filed, the nonlinear element suppresses such dispersion for stabilizing the read/write operation of the memory cell similarly to the above.

Also when reducing the thickness of the ferroelectric film for reducing dispersion in coercive filed of the ferroelectric film, the nonlinear element can keep the space between electrodes at a prescribed value. Thus, it is possible to prevent dielectric breakdown caused by excess reduction of the space between the electrodes.

The nonlinear element may simply be stacked on the ferroelectric film, whereby the chip area is not increased.

In the aforementioned nonvolatile semiconductor memory device, the nonlinear element is preferably a dielectric material having a double hysteresis characteristic. Dispersion in coercive filed can be suppressed and dielectric breakdown can be prevented without increasing the chip area by stacking the dielectric material having a double hysteresis characteristic on the ferroelectric film.

In the aforementioned nonvolatile semiconductor memory device, the nonlinear element is preferably an antiferroelectric material. Also in this case, dispersion in coercive filed can be suppressed and dielectric breakdown can be prevented without increasing the chip area.

In the aforementioned nonvolatile semiconductor memory device, the nonlinear element is preferably a ferroelectric material in a paraelectric phase. Also in this case, dispersion in coercive filed can be suppressed and dielectric breakdown can be prevented without increasing the chip area.

Preferably, the aforementioned nonvolatile semiconductor memory device is capable of storing at least four values. Thus, storage of at least four values in a single memory cell can be implemented by combining the ferroelectric film and the nonlinear element with each other.

Preferably, the aforementioned nonvolatile semiconductor memory device has a structure capable of applying at least two voltage pulses of different values to the ferroelectric film and the nonlinear element. Thus, at least four values can be stably stored.

In the aforementioned nonvolatile semiconductor memory device, the nonlinear element is preferably a varistor. Thus, dispersion in coercive filed can be suppressed and dielectric breakdown can be prevented without increasing the chip area by stacking the varistor on the ferroelectric film.

In the aforementioned nonvolatile semiconductor memory device, the nonlinear element is preferably an element having a nonlinear voltage dependency of a current. Thus, dispersion in coercive filed can be suppressed and dielectric breakdown can be prevented without increasing the chip area by stacking the element having the nonlinear voltage dependency of the current on the ferroelectric film.

In the aforementioned nonvolatile semiconductor memory device, the nonlinear element preferably has at least two films electrically connected with the ferroelectric film and having such a characteristic that the quantity of increase of a positive electric flux density D with respect to an electric field E is small in a low electric field region and large in a high electric field region in a dependency of the electric field density D and the electric field E or such a characteristic that the quantity of increase of a positive current I is small in a low field or low electric voltage region and large in a high electric field or high voltage region in a dependency of the current I and the electric field E or an applied voltage. Also in this case, dispersion in coercive filed can be suppressed and dielectric breakdown can be prevented without increasing the chip area.

The nonvolatile semiconductor memory device preferably further comprises an insulated gate field-effect transistor and a capacitor electrically connected with one of a pair of source/drain regions of the insulated gate field-effect transistor, and the ferroelectric film and the nonlinear element are preferably held between a pair of electrodes included in the capacitor. Thus, the present invention is applicable to a DRAM type FRAM memory cell.

The aforementioned nonvolatile semiconductor memory device preferably further comprises an insulated gate field-effect transistor, and the ferroelectric film and the nonlinear element are preferably held between a region held between a pair of source/drain regions of the insulated gate field-effect transistor and a control gate electrode. Thus, the present invention is applicable to an MFSFET type FRAM memory cell.

The aforementioned nonvolatile semiconductor memory device preferably further comprises an insulated gate field-effect transistor. The insulated gate field-effect transistor has a pair of source/drain regions and a floating gate electrode and a control gate electrode formed on a region held between the pair of source/drain regions, and the ferroelectric film and the nonlinear element are held between the control gate electrode and the floating gate electrode. Thus, the present invention is applicable to an MFMISFET type FRAM memory cell.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

Figure 1:
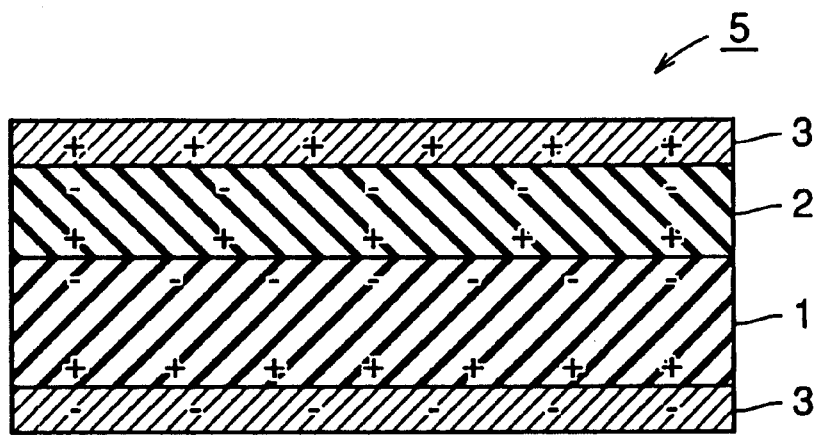
FIG. 1 is a sectional view schematically showing the structure of a nonvolatile semiconductor memory device according to a first embodiment of the present invention.

FIG. 1 illustrates a capacitor part implementing nonvolatile storage as a specific example according to a first embodiment of the present invention.

Figure 2:
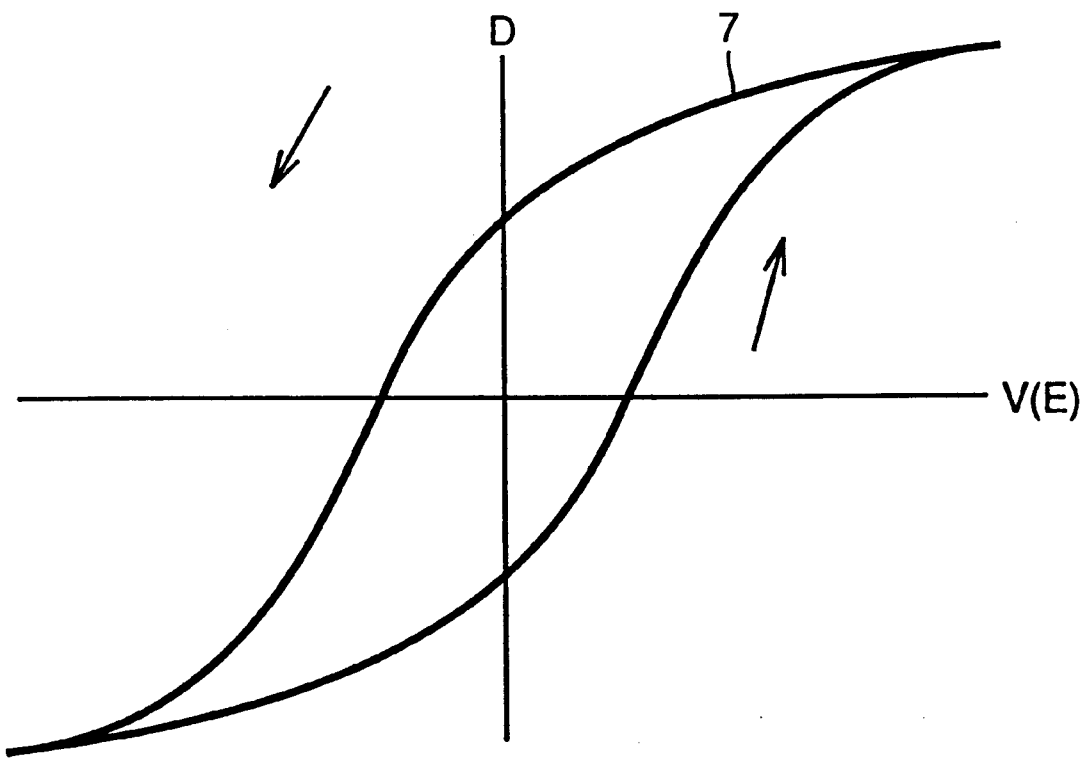
FIG. 2 illustrates a D-V characteristic curve of a ferroelectric film.

Referring to FIG. 1, a capacitor 5 implementing the nonvolatile storage according to this embodiment has a ferroelectric film 1, a nonlinear element 2 and a pair of electrodes 3. The ferroelectric film 1 has such a characteristic that the direction of spontaneous polarization is inverted when an electric field is externally applied to crystals having spontaneous polarization, and a dependency 7 in an electric flux density D and an electric field E (voltage V) draws a hysteresis loop as shown in FIG. 2.

Figure 3:
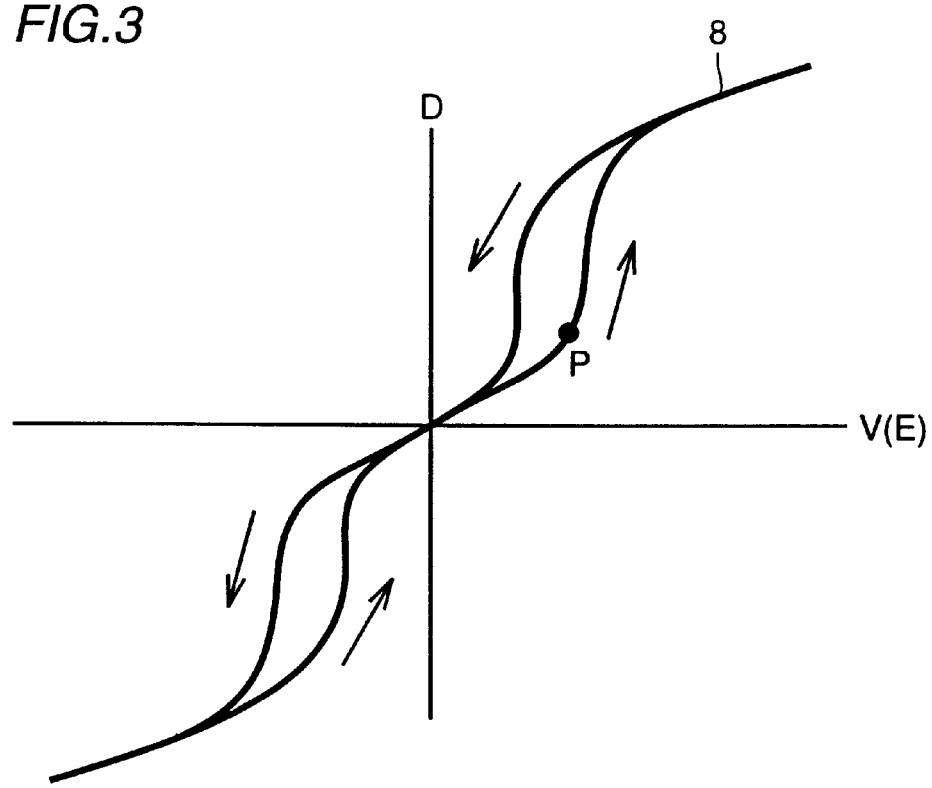
FIG. 3 illustrates a D-V characteristic curve of a nonlinear element.
Figure 4A:
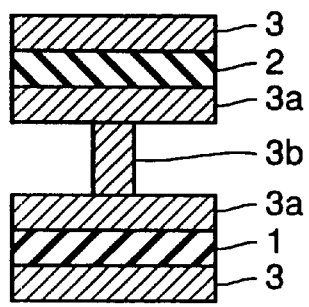
FIGS. 4A, 4B, 4C and 4D illustrate specific exemplary structures of the nonlinear element electrically connected to the ferroelectric film through a conductor.
Figure 4B:
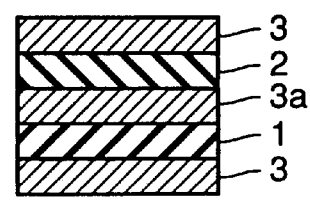
Figure 4C:
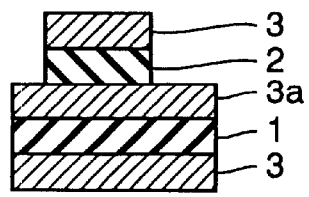
Figure 4D:
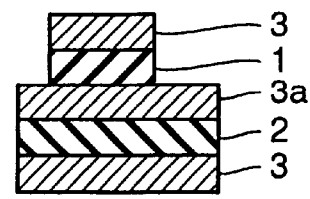

The nonlinear element 2 is electrically connected with the ferroelectric film 1. This nonlinear element 2 has such a characteristic that the quantity of increase of a positive flux density D is small in a low field region below a threshold P and large in a high field region beyond the threshold P in a dependency 8 of the electric flux density D and the electric field E (voltage V), as shown in FIG. 3. This nonlinear element 2 has a double hysteresis characteristic as shown in FIG. 3, for example. D-E and D-V characteristics are substantially identical to each other.

The pair of electrodes 3 hold the ferroelectric film 1 and the nonlinear element 2 therebetween and couple the ferroelectric film 1 and the nonlinear element 2 with each other in relation to the electric field.

Signs "+" and "−" in the ferroelectric film 1 and the nonlinear element 2 shown in FIG. 1 show polarization states, and those in the electrodes 3 show positive and negative true charges stored in the electrodes 3 respectively.

In the above description, the expression that the nonlinear element 2 is electrically connected with the ferroelectric film 1 includes such a state that the nonlinear element 2 is connected with the ferroelectric film 1 in relation to the electric field and such a state that the nonlinear element 2 is electrically connected with the ferroelectric film 1 through a conductor.

The expression that the nonlinear element 2 is connected with the ferroelectric film 1 in relation to the electric field indicates that the nonlinear element 2 and the ferroelectric film 1 held between the pair of electrodes 3 are directly in contact with each other as shown in FIG. 1, for example.

The expression that the nonlinear element 2 is electrically connected with the ferroelectric film 1 through a conductor indicates that the ferroelectric film 1 and the nonlinear element 2 are electrically connected with each other through an intermediate electrode 3a or a conductive plug 3b, as shown in any of FIGS. 4A to 4D.

Figure 5:
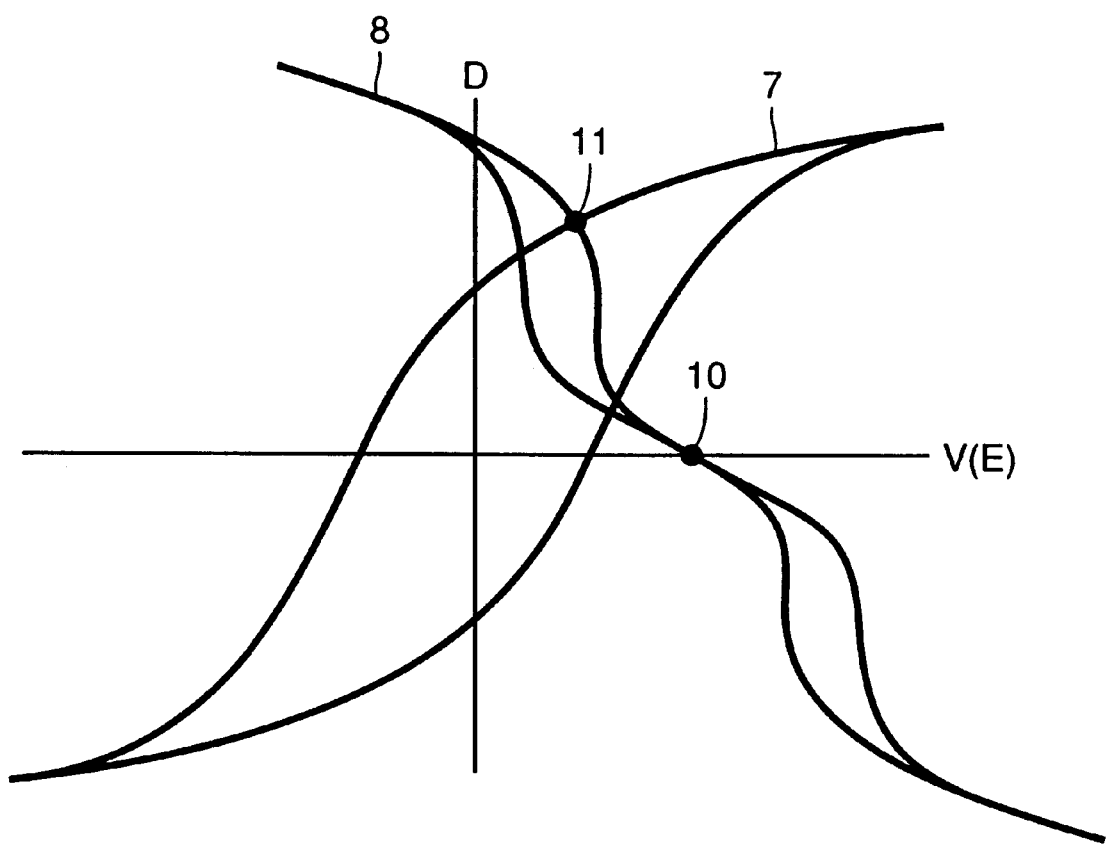
FIG. 5 illustrates the D-V characteristic curves of the ferroelectric film and the nonlinear element.

FIG. 5 is a diagram for obtaining electric displacement and a divided voltage resulting from change of the electrode voltage in the capacitor 5 shown in FIG. 1. Referring to FIG. 5, the vertical axis (y axis) shows true charges in the electrodes, i.e., the electric flux density D, and the horizontal axis (x axis) shows the voltage V or the electric field E. Each of the dependency 7 of the ferroelectric film 1 and the dependency 8 of the nonlinear element 2 is drawn with reference to the voltage of the electrode 3 in contact therewith, while the dependency 8 of the nonlinear element 2 is shown in a horizontally inverted state.

Assuming that the potential of the electrode 3 in contact with the ferroelectric film 1 is zero in FIG. 5, it follows that an x axis intercept 10 indicates the voltage across the electrodes 3. When the potential across the electrodes 3 changes, therefore, it follows that the dependency 8 of the nonlinear element 2 horizontally moves along the horizontal axis. It also follows that the x-coordinate of the intersection point 11 between the two dependencies 7 and 8 expresses the potential at the boundary between the ferroelectric film 1 and the nonlinear element 2 (i.e. voltage acting on the ferroelectric film 1: divided voltage) and the y coordinate expresses the current true changes on the electrodes 3.

Figure 6:
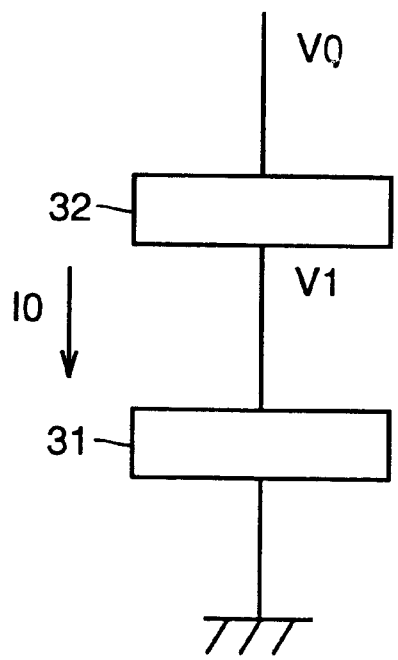
FIG. 6 illustrates two elements serially connected with each other.
Figure 7:
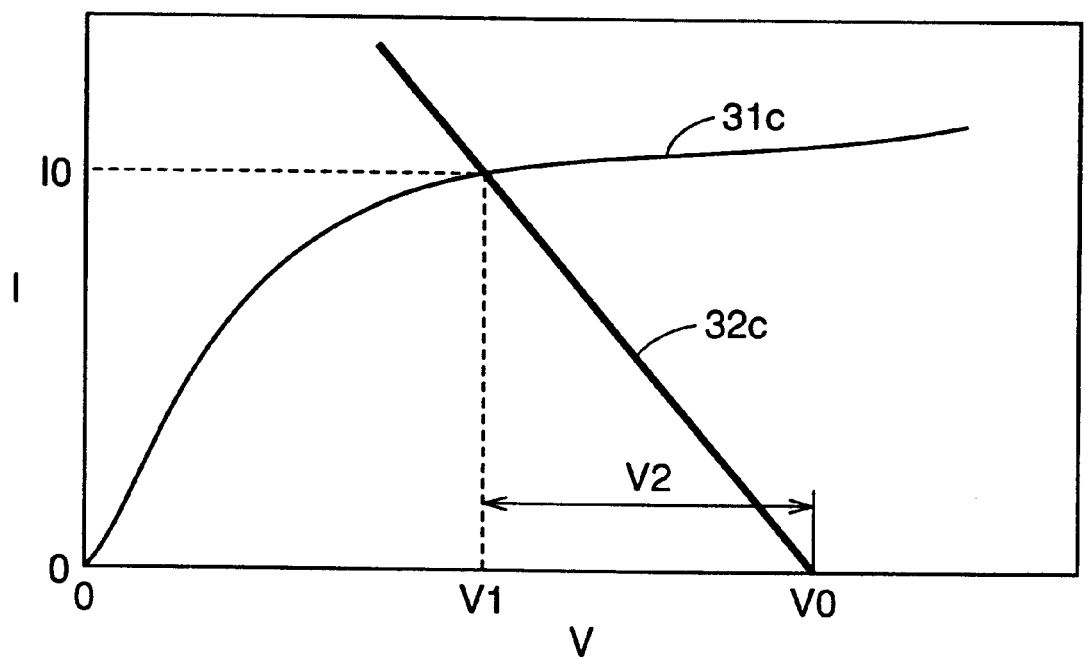
FIG. 7 illustrates I-V characteristics of the two elements serially connected with each other.

The method of obtaining the voltage acting on the ferroelectric film 1 and the true charges at this voltage by displaying two dependency curves depends on the following theory:

When first and second elements 31 and 32 are serially connected in an electronic circuit as shown in FIG. 6, a divided voltage V1 and a current value I0 of the circuit may be obtained from load curves in current-voltage (I-V) characteristics as shown in FIG. 7. According to this method, an I-V characteristic curve 31c of the first element 31 is drawn on the basis of 0 V and an I-V characteristic curve 32c of the second element 32 is drawn on the basis of an applied voltage V0. This is because the first element 31 is connected with 0 V and the second element 32 is connected with V0.

A voltage V2 applied to the second element 32 on the basis of V0 is V1−V0, i.e., negative. Thus, the sign of the applied voltage V2 is reverse to that of the voltage applied to the first element 31, and hence the I-V characteristic curve 32c inverted in relation to the voltage must be employed as to the second element 32c.

The applied voltage V1 and the current I0 of the first element 31 are on the I-V characteristic curve 31c, while the applied voltage V2 and the current I0 of the second element 32 are on the I-V characteristic curve 32c. In other words, the intersection point between the I-V characteristic curves 31c and 32c satisfies the both applied voltages and currents of the first and second elements 31 and 32. Therefore, the divided voltage V1 and the current I0 can be obtained from this intersection point.

While the aforementioned method obtains the divided voltage V1 and the current value I0 of the circuit from the relations V=V1+V2, V1=f1 (I0) and V2=f2 (I0), this method can be similarly employed also in the electric flux density-voltage (D-V) characteristics shown in FIG. 5.

The D-V characteristics (while electric flux density-electric field (D-E) characteristics are employed in general, the D-V characteristics are employed for convenience of illustration from the relation V=∈E, where ∈ represents a dielectric constant) of the ferroelectric film 1 and the nonlinear element 2 are nonlinear characteristics having the hystereses shown in FIGS. 2 and 3 respectively, similarly to the D-E characteristics. When serially connecting the ferroelectric film 1 and the nonlinear element 2 with each other, there are the relations V=V1+V2, V1=f1 (D0) and V2=f2 (D0), where the electric flux density D0 is common. Similarly to the aforementioned method with reference to the I-V characteristics, therefore, the divided voltage and the common electric flux density can be obtained from the intersection point 11 of the state drawing the D-V characteristic curve 7 of the ferroelectric film 1 on the basis of 0 V and drawing the reversed D-V characteristic curve 8 of the nonlinear element 2 on the basis of V0 as shown in FIG. 5.

According to this embodiment, the quantity of increase of the positive electric flux density D with respect to the electric field E is small in the low field region and large in the high field region in the dependency of the electric flux density D and the electric field E of the nonlinear element 2, as shown in FIG. 3. The quantity of increase of the positive electric flux density D with respect to the electric field E is small in the low field region, and hence an electric field acting on the ferroelectric film 1 and polarization inversion of the ferroelectric film 1 is suppressed in the low field region. In the high field region, on the other hand, the quantity of increase of the positive electric flux density D with respect to the electric field E is large and hence the electric field acting on the ferroelectric film 1 abruptly increases and prompts polarization inversion of the ferroelectric film 1 in the high field region. Thus, polarization inversion of the ferroelectric film 1 is abruptly prompted in the high field region and hence, also when the ferroelectric film 1 is dispersed in coercive filed, the nonlinear element 2 suppresses such dispersion for stabilizing a read/write operation of a memory cell.

Also when reducing the thickness of the ferroelectric film 1 for reducing dispersion in coercive filed, the nonlinear element 2 can keep the distance between the electrodes 3 at a prescribed value. Therefore, it is also possible to prevent dielectric breakdown resulting from an excessively small distance between the electrodes 3.

Further, the nonlinear element 2 may simply be stacked on the ferroelectric film 1, whereby the chip area is not increased.

The above is now described in detail.

Figure 8:
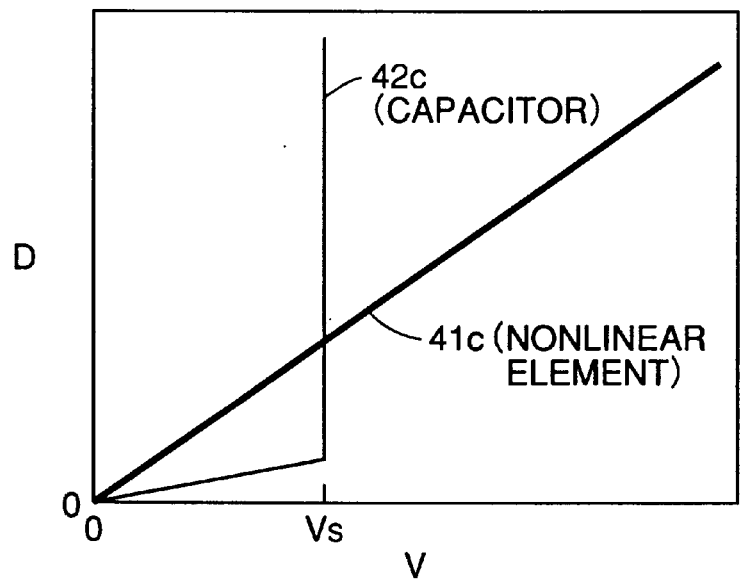
FIG. 8 illustrates D-V characteristic curves of a capacitor and a nonlinear element.

First, consider the case of serially connecting a linear capacitor having a D-V characteristic shown in FIG. 8 and a nonlinear element with each other. Referring to FIG. 8, D-V characteristic curves 41c and 42c are inclined by $\in/d$ corresponding to electrostatic capacitance. In other words, it follows the nonlinear element has characteristics equivalent to a capacitor of low capacitance up to Vs and has infinite electrostatic capacitance beyond Vs.

Figure 9:
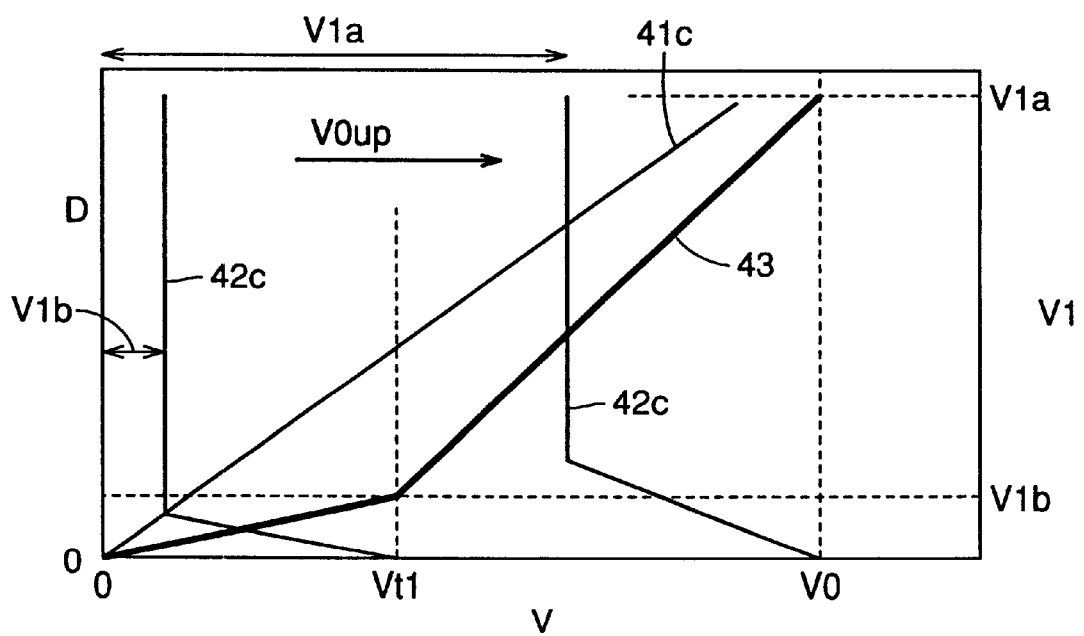
FIG. 9 illustrates states upon changing voltages applied to the nonlinear element and the capacitor.
Figure 10:
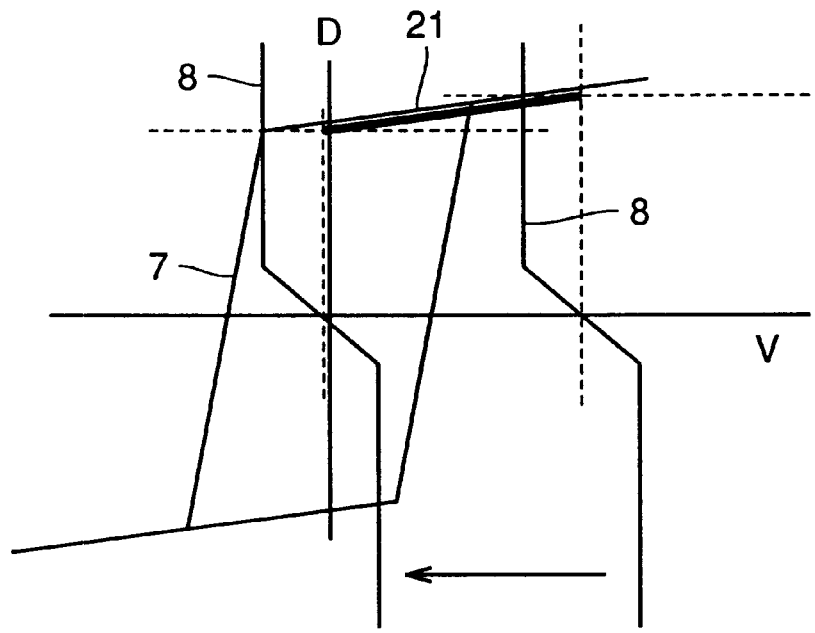
FIGS. 10 to 18 successively illustrate the relation between electric flux densities D and voltage V in a combinational structure of the ferroelectric film and the nonlinear element.
Figure 11:
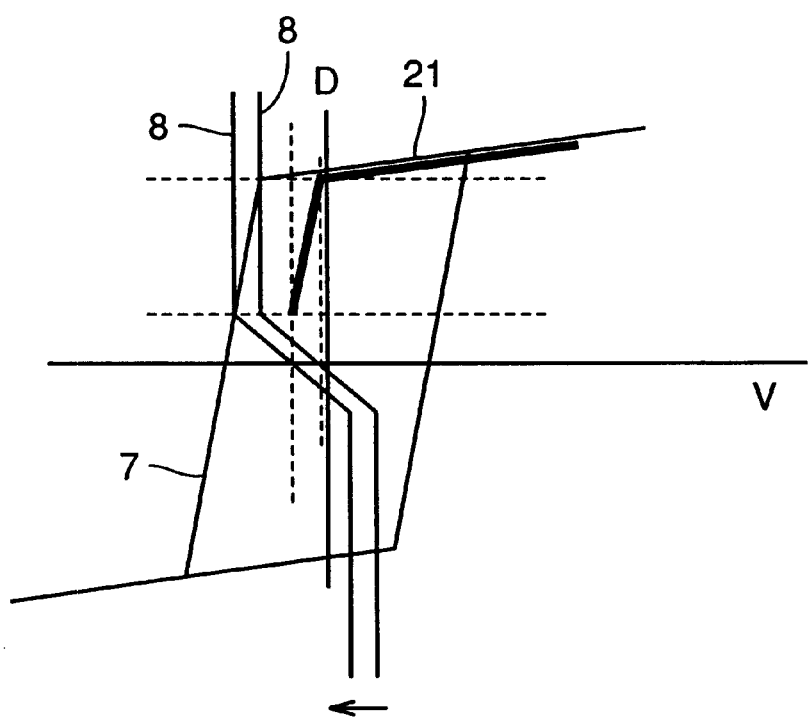
Figure 12:
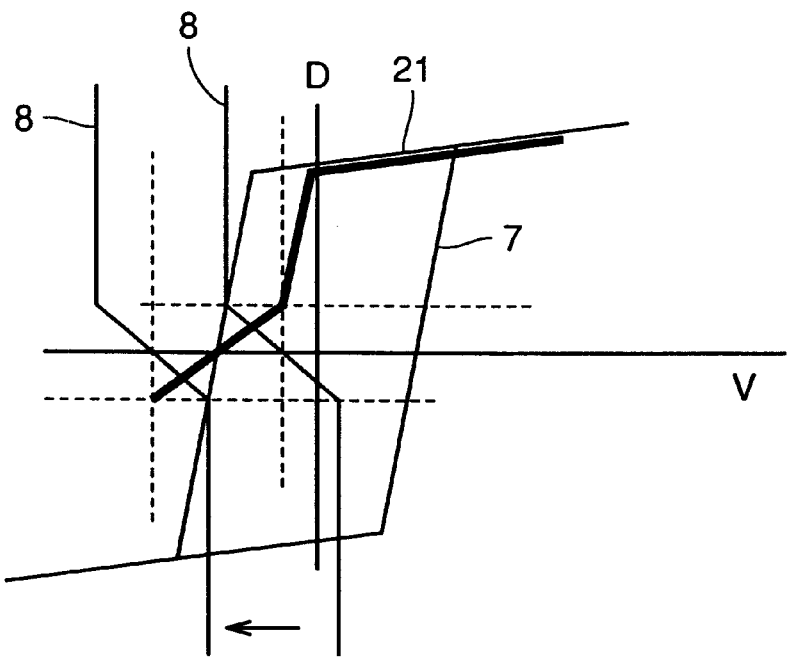
Figure 13:
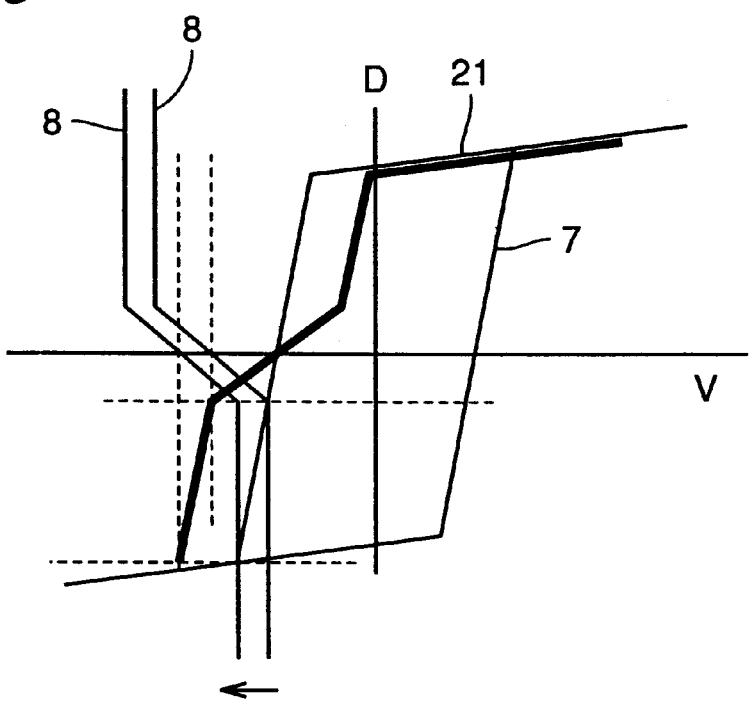
Figure 14:
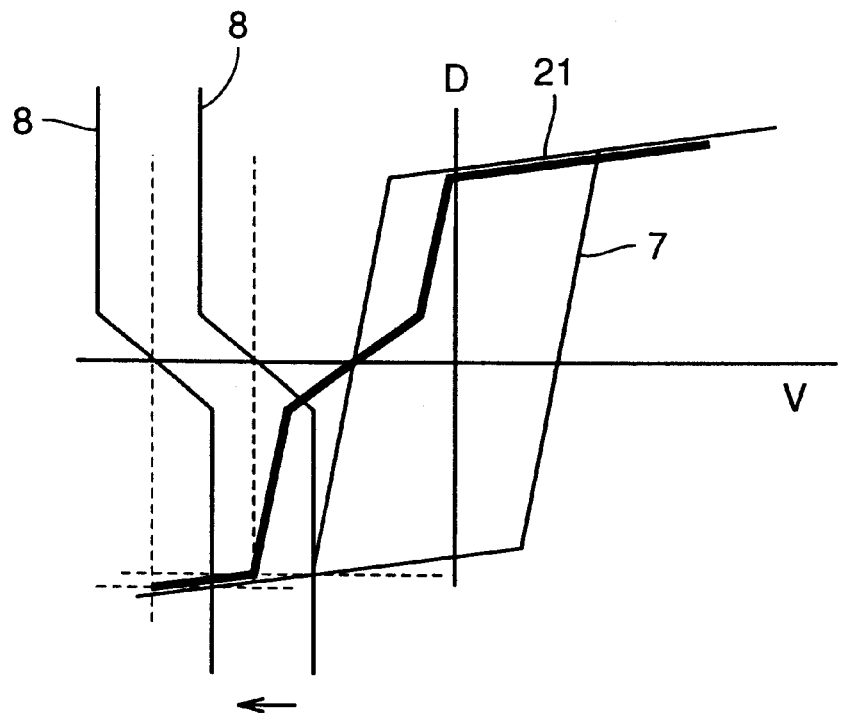
Figure 15:
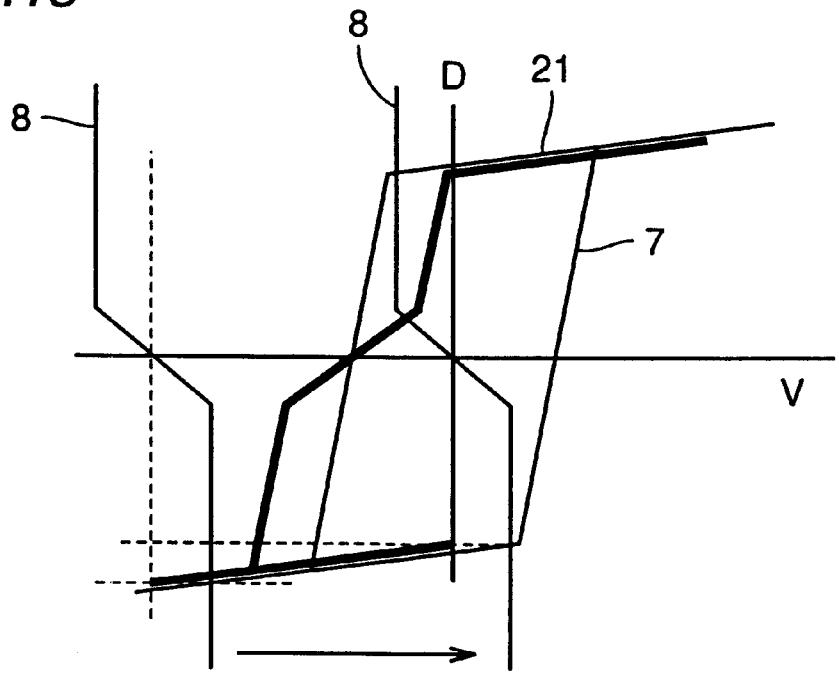
Figure 16:
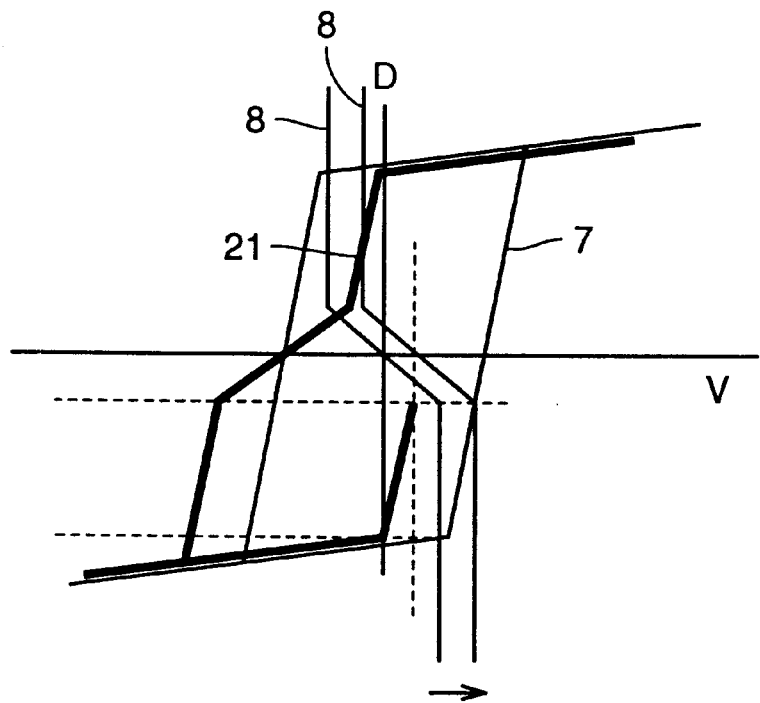
Figure 17:
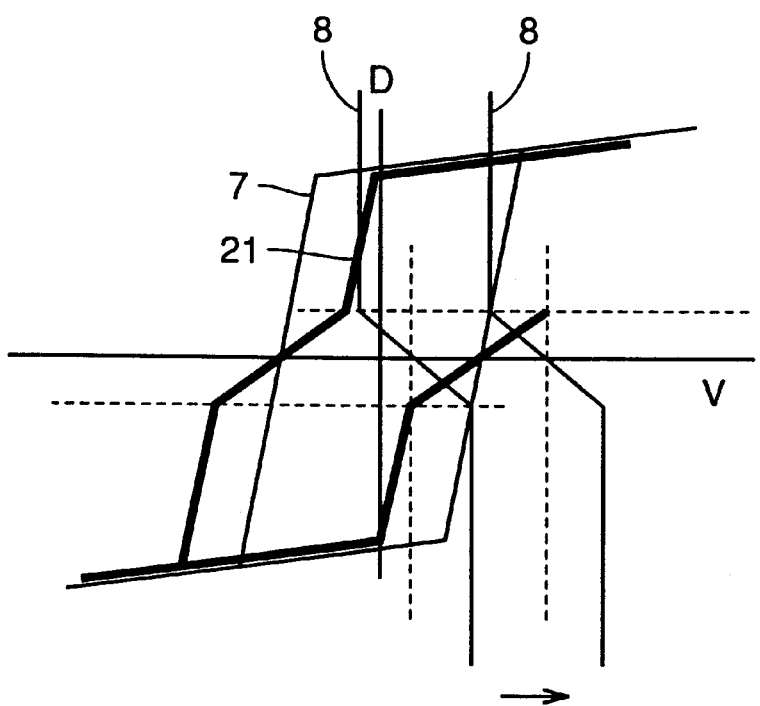

When increasing an applied voltage V0 in this series circuit, most of the voltage V0 is applied to the nonlinear element between zero and Vt1 and a voltage (divided voltage) applied to the capacitor is only (0–V1b) as shown in FIG. 9. When the applied voltage V0 exceeds Vt1, however, the gradient of the nonlinear element is infinite and hence it follows that the quantity of increase of the applied voltage V0 is entirely applied to the capacitor while the divided voltage V1 reaches (V1b–V1a) and is abruptly increased. Referring to FIG. 9, a thick line 43 shows change of the divided voltage V1 with respect to the applied voltage V0.

Thus, it is understood that the voltage acting on the ferroelectric film 1 abruptly increases in the high voltage region when the quantity of increase of the positive electric flux density with respect to the voltage is small in the low voltage region and large in the high voltage region in the nonlinear element 2.

The relation between the electric flux density and the applied voltage V0 on the intersection point of each D-V characteristic curve in the case of serially connecting the ferroelectric film 1 and the nonlinear element 2 with each other is obtained by plots shown in FIGS. 10 to 18 similarly to the above. Referring to each of FIGS. 10 to 18, the D-V characteristic curves 7 and 8 of the ferroelectric film 1 and the nonlinear element 2 are simplified, and a curve 21 showing the relation between the electric flux density and the applied voltage V0 is obtained from these curves 7 and 8.

As the contrast, the relation between the electric flux density and the applied voltage V0 on the intersection point of each D-V characteristic curve in the case of serially connecting the ferroelectric film with a linear element is obtained by plots shown in FIGS. 19 to 23. Also in each of FIGS. 19 to 23, the D-V characteristic curve 7 of the ferroelectric film 1 is simplified, and a curve 22 showing the relation between the electric flux density and the applied voltage V0 is obtained from the D-V characteristic curves 7 and 9 of the ferroelectric film and the linear element.

Figure 18:
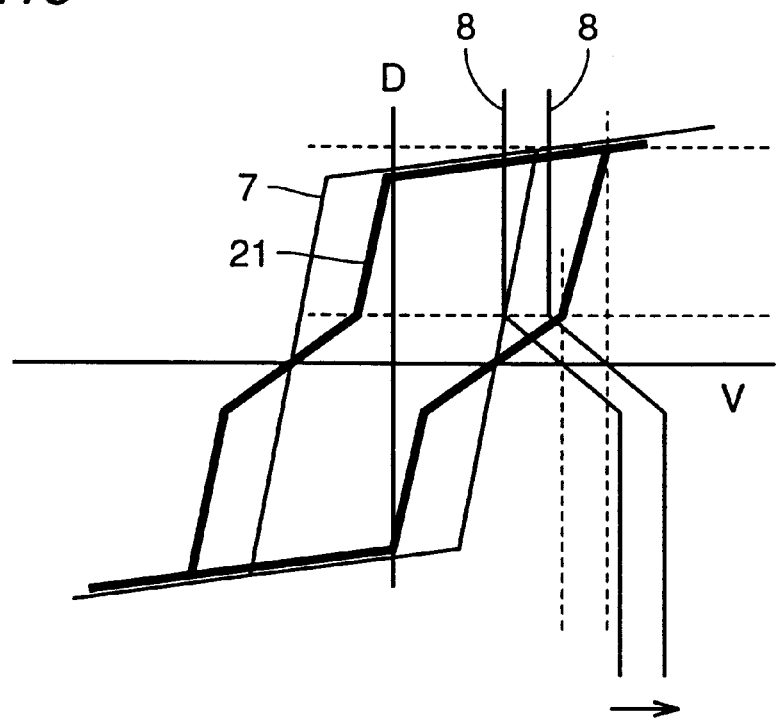
Figure 19:
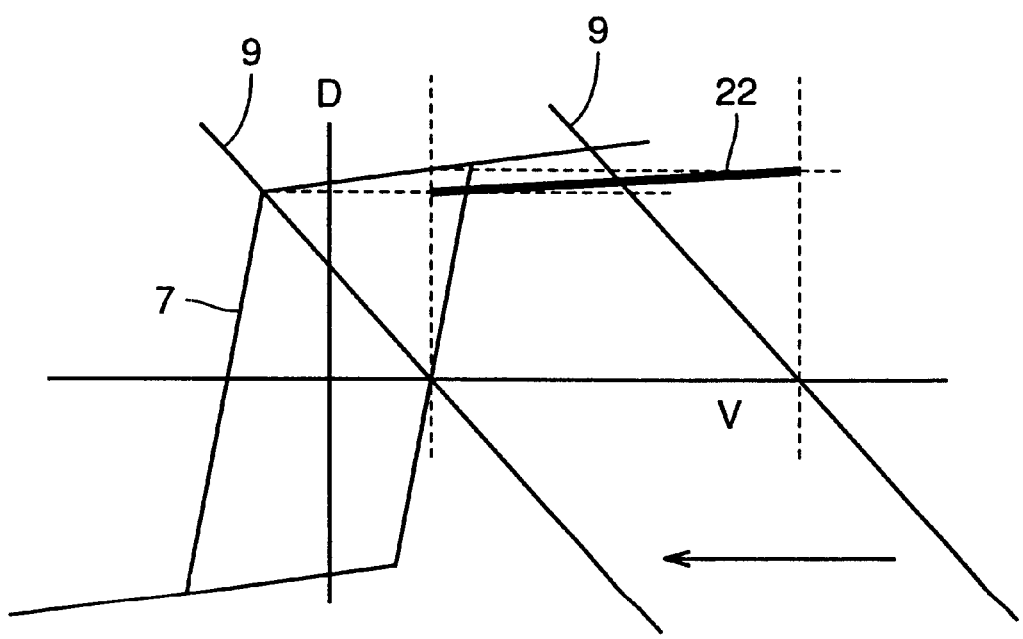
FIGS. 19 to 23 successively illustrate the relation between electric flux densities D and voltage V in a combinational structure of the ferroelectric film and a linear element.
Figure 20:
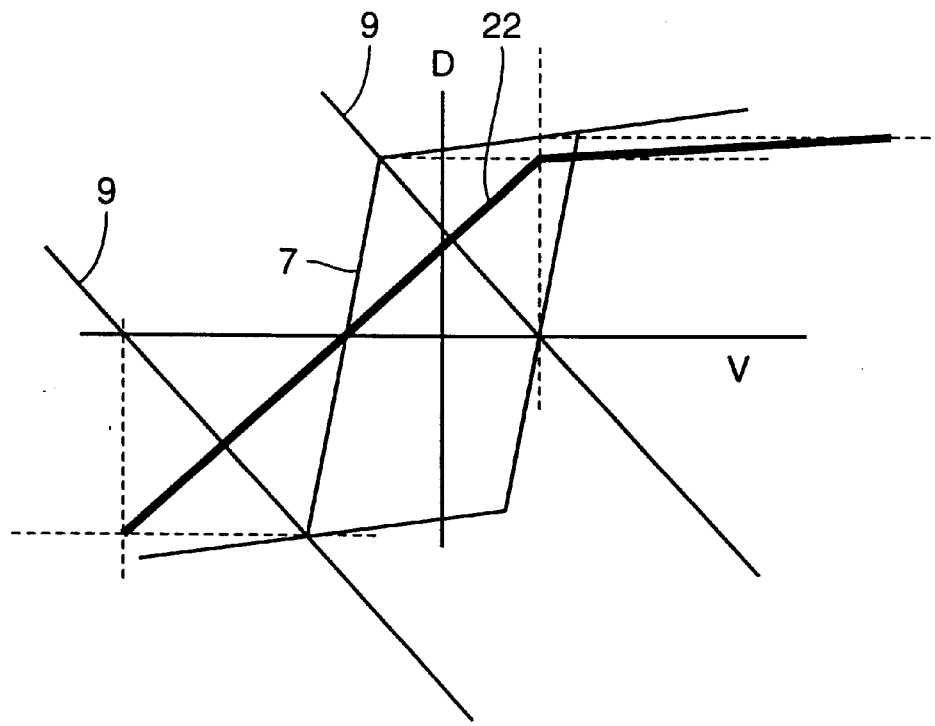
Figure 21:
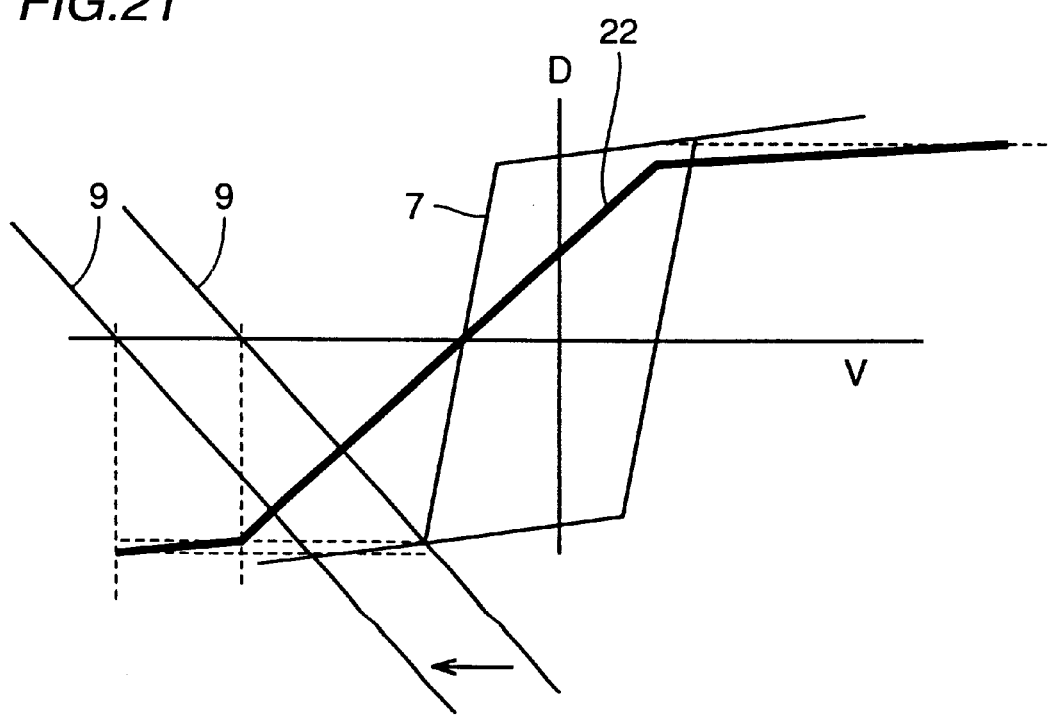
Figure 22:
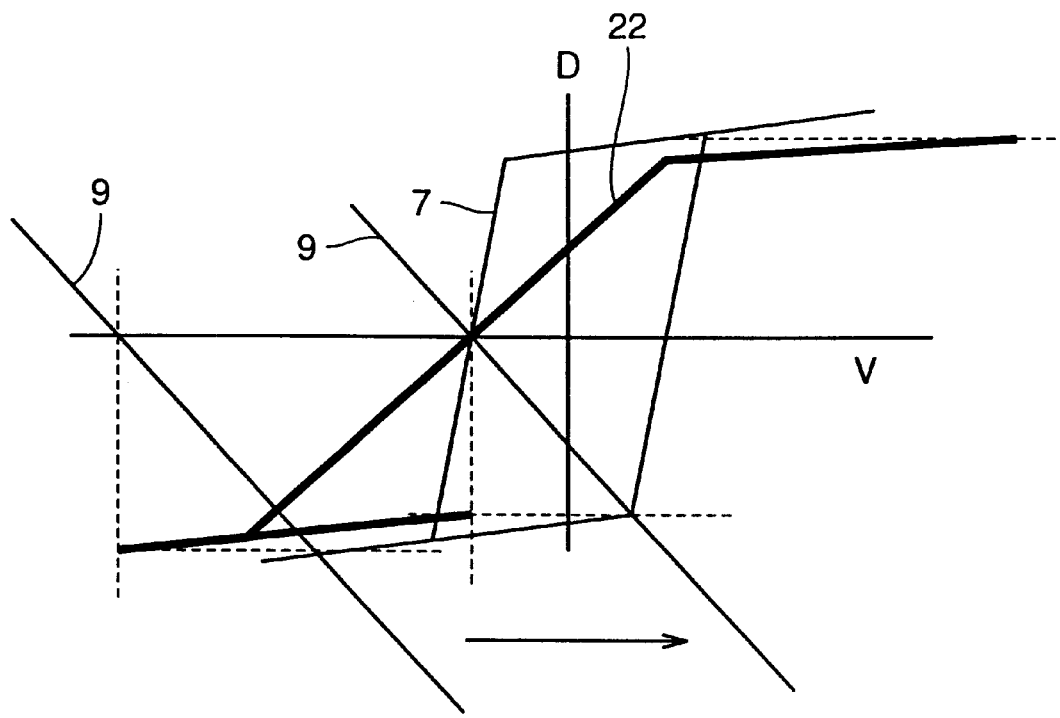
Figure 23:
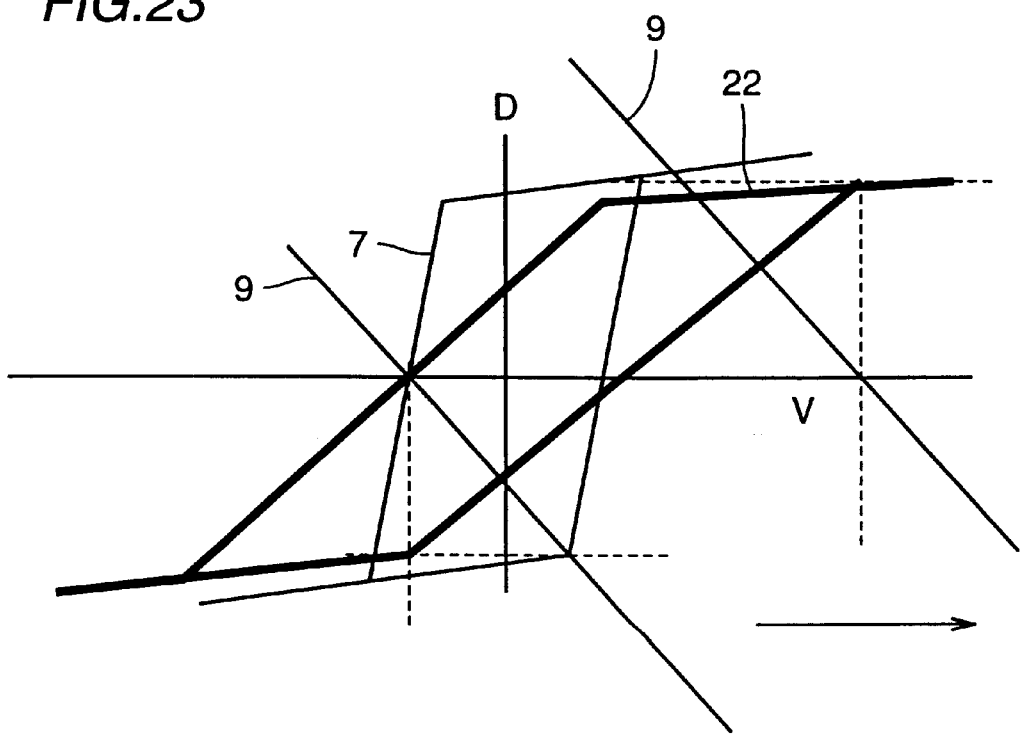

Referring to FIGS. 18 and 23, the D-V characteristic curve 22 is loosely inclined on the portions intersecting with the x axis when combining the linear element with the ferroelectric film (FIG. 23). When combining the nonlinear element (FIG. 18), however, the D-V characteristic curve 21 has steep inclination at voltages exceeding a threshold. Thus, it is understood that the structure combining the nonlinear element with the ferroelectric film can more effectively suppress dispersion in coercive filed as compared with the structure combining the linear element with the ferroelectric film.

However, when combining a nonlinear element having such a characteristic that the quantity of increase of a positive electric flux density D with respect to an electric field E is large in a low field region and small in a high field region in a dependency of the electric flux density D and the electric field E with the ferroelectric film, it follows that a divided voltage of the ferroelectric film abruptly increases in the low field region and a high field region exceeding a threshold loosely increases, and hence dispersion of polarization inversion disadvantageously increases.

Thus, it is understood necessary to combine the ferroelectric film with a nonlinear element having such a characteristic that the quantity of increase of a positive electric field density D with respect to an electric field E is small in a low field region and large in a high field region in a dependency of the electric field density D and the electric field E, in order to suppress dispersion in coercive filed.

D-V characteristics are now compared with reference to a combinational structure of a ferroelectric film and a nonlinear element and structures having only ferroelectric films.

Figure 24A:
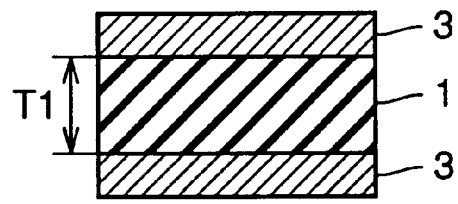
FIG. 24A shows a structure forming a thick ferroelectric film between a pair of electrodes.
Figure 24B:
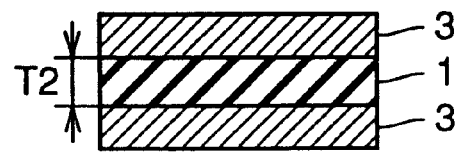
FIG. 24B shows a structure forming a thin ferroelectric film between a pair of electrodes and FIG. 24C shows a structure forming a ferroelectric film and a nonlinear element between a pair of electrodes.
Figure 24C:
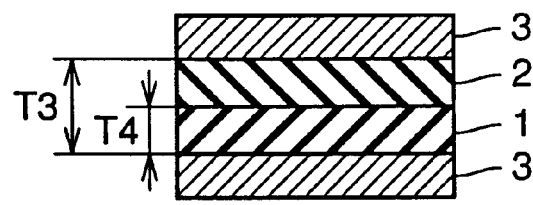
Figure 25:
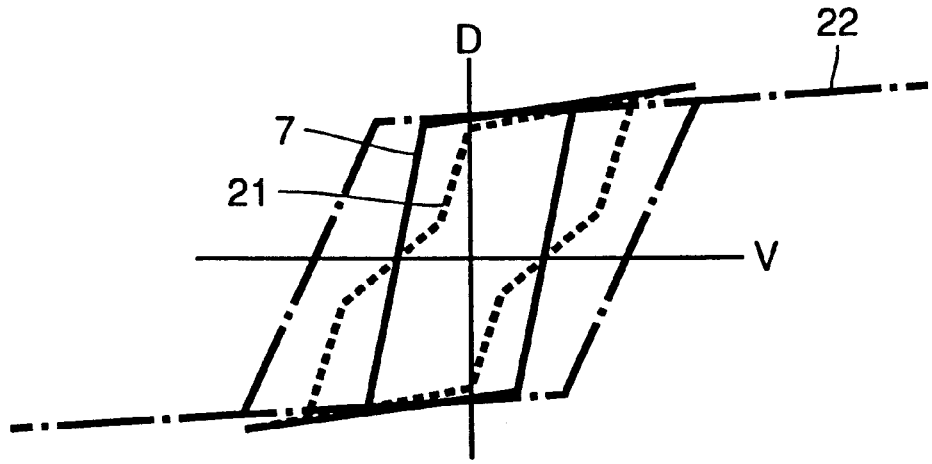
FIG. 25 illustrates D-V characteristic curves corresponding to the structures shown in FIGS. 24A to 24C respectively.

FIGS. 24A, 24B and 24C are sectional views showing the structures of compared objects. These objects are formed by holding a ferroelectric film 1 having a large thickness T1 between a pair of electrodes 3 (FIG. 24A), holding a ferroelectric film 1 having a small thickness T2 between a pair of electrodes 3 (FIG. 24B) and holding a ferroelectric film 1 and a nonlinear element 2 stacked with each other to have a thickness T3 as a whole between a pair of electrodes 3 (FIG. 24C) respectively. The thickness T1 in the structure shown in FIG. 24A is identical to the thickness T3 in the structure shown in FIG. 24C, and the thickness T2 in the structure shown in FIG. 24B is identical to a thickness T4 in the structure shown in FIG. 24C. FIG. 25 shows the D-V characteristics of these structures in comparison with each other.

Referring to FIG. 25, the structure (FIG. 24B) having the thin ferroelectric film 1 exhibits a steeply inclined D-V characteristic curve 7, while the structure (FIG. 24A) having the thick ferroelectric film 1 exhibits a loosely inclined D-V characteristic curve 22 and a large applied voltage V for zeroing the electric field E.

The structure (FIG. 24C) according to this embodiment, having the same thickness as the structure (FIG. 24A) having the thick ferroelectric film 1 as a whole, exhibits a D-V characteristic curve 21 more steeply inclined than the D-V characteristic curve 22. Therefore, dispersion in coercive filed can be more suppressed by combining the ferroelectric film 1 with the nonlinear element 2 as compared with the structure having only the ferroelectric film 1 of the same thickness.

In the structure (FIG. 24C) according to this embodiment, the applied voltage V for zeroing the electric field E is smaller than that in the structure (FIG. 24A) having the thick ferroelectric film 1. Therefore, this structure can operate at a lower voltage than the structure (FIG. 24A) having the thick ferroelectric film 1.

Also when reducing the thickness of the ferroelectric film 1, the nonlinear element 2 combined therewith can keep the space between the electrodes 3 at a prescribed value (T3). Therefore, it is possible to suppress dispersion in coercive filed by reducing the thickness of the ferroelectric film 1 while keeping a large space between the electrodes 3. Thus, voltage resistance across the electrodes 3 can be more increased than the structure (FIG. 24B) having only the thin ferroelectric film 1, and dielectric breakdown can be prevented.

Figure 26:
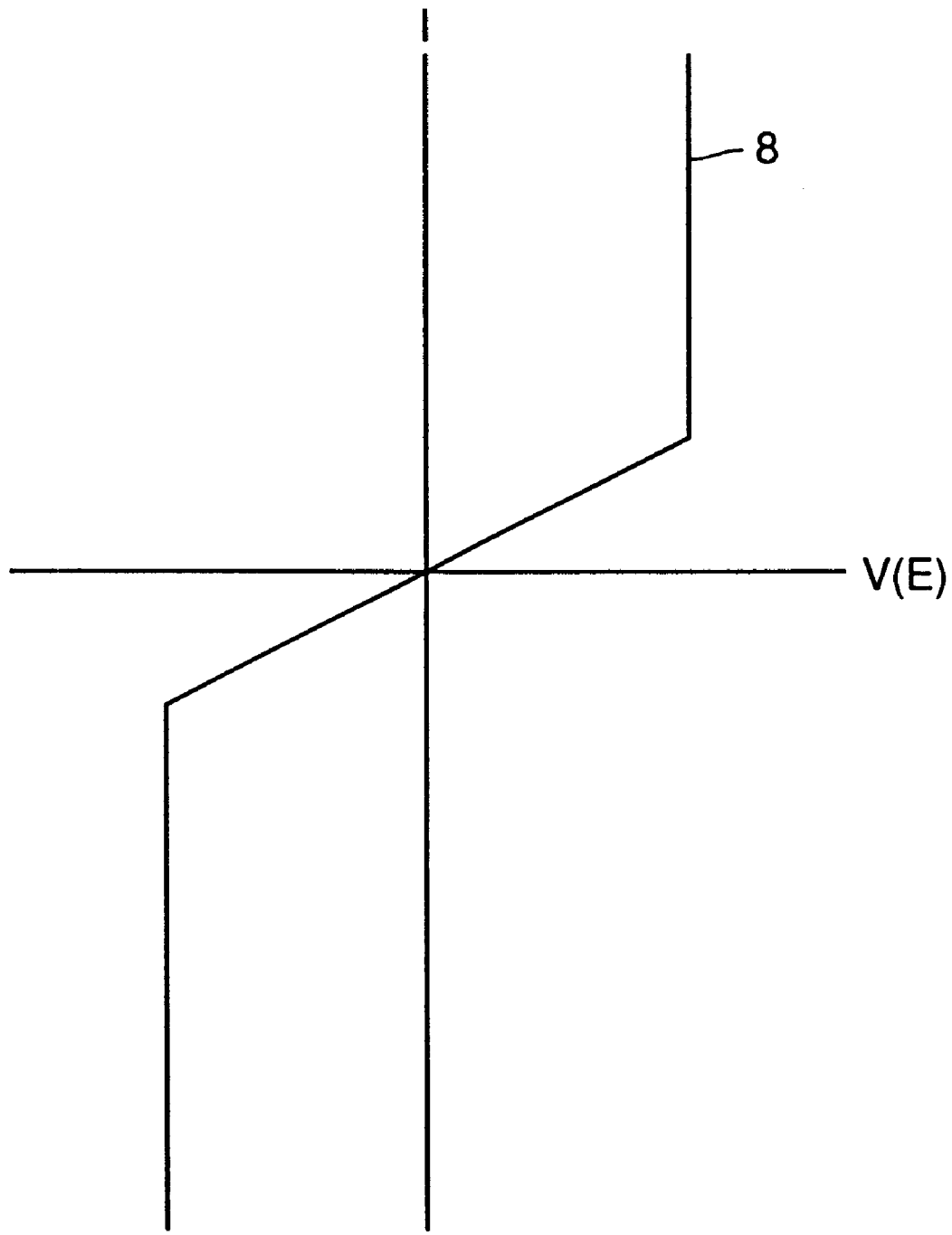
FIG. 26 illustrates an I-V (E) characteristic curve of such a nonlinear element that the quantity of increase of a positive current I is small in a low field or low voltage region and large in a high field or high voltage region in a dependency of the current I and an electric field E or an applied voltage V.

While the nonlinear element 2 has been described with reference to the dependency of the electric flux density D and the electric field E shown in FIG. 3, the nonlinear element 2 can attain an effect similar to the above also when the quantity of increase of the positive current I is small in a low field or low voltage region and large in a high field or high voltage region in the dependency of the current I and the electric field E or the applied voltage, as shown in FIG. 26.

The ferroelectric film 1 shown in FIG. 1 can be prepared from $Pb(Zr_{0.5}Ti_{0.5})O_3$, for example, and the nonlinear element 2 can be prepared from an antiferroelectric material such as $PbZrO_3$, for example.

The material for the ferroelectric film 1 is not restricted to the above but a barium titanate-based displacive ferroelectric material such as $Pb(Zr_xTi_{(1-x)})O_3$ ($0 \leq x \leq 0.96$), $Pb_xLa_{(1-x)}Zr_yTi_{(1-y)}O_3$ ($0 \leq x \leq 1$, $0 \leq y \leq 1$), $BaTiO_3$ or $PbTiO_3$, a displacive ferroelectric material such as $LiNbO_3$, $KTaO_3$, $NaNb_5O_{15}$, $SrBi_2Ta_2O_9$, $Bi_4Ti_3O_{12}$, $(Ba,Sr)Nb_2O_6$, $SrBi_2Ta_2O_9$ or $Bi_4Ti_3O_{12}$, an order-disorder ferroelectric material such as $NaNO_2(NH_2CH_2COOH)_3$: $H_2SO_4$ or Rochelle salt or a solid solution prepared by partially replacing any of these materials with ions may be employed, for example.

The nonlinear element 2 is not restricted to the above material either but may alternatively be prepared from another antiferroelectric material, a ferroelectric material in a paraelectric phase, a conductor having a nonlinear field dependency of a current or a element having a nonlinear voltage dependency of a current.

The antiferroelectric material employed for the nonlinear element 2 can be prepared from $RbNO_3$, $NaNbO_3$, $Pb(Zr_xTi_{(1-x)})O_3$ ($0.9 \leq x \leq 1$), $PbHfO_3$, $Pb(Mg_{1/2}W_{1/2})O_3$, $Pb(Cd_{1/2}W_{1/2})O_3$, $Pb(Mn_{1/2}W_{1/2})O_3$, $Pb(Y_{1/2}Nb_{1/2})O_3$, $Pb(Ho_{1/2}N_{1/2})O_3$, $Pb(Lu_{1/2}Nb_{1/2})O_3$, $Pb(Yb_{1/2}Ta_{1/2})O_3$, $Pb(Lu_{1/2}Ta_{1/2})O_3$ or $Pb(Mn_{2/3}W_{1/3})O_3$ or a solid solution cons these materials, for example.

The ferroelectric material in a paraelectric phase employed for the nonlinear element 2 can be prepared from $Ba(Mg_{1/2}Te_{1/2})O_3$, $Pb(Co_{1/2}W_{1/2})O_3$, $Pb(Fe_{1/2}Ta_{1/2})O_3$, $Pb(Mg_{1/3}Nb_{2/3})O_3$, $Pb(Mg_{1/3}Ta_{2/3})O_3$, $Pb(Co_{1/3}Ta_{2/3})O_3$, $Ba_2LiTa_5O_{15}$, $Pb_2KTa_5O_{15}$, $Ba_3NaYNb_{10}O_{30}$, $Ba_3NaLaNb_{10}O_{30}$, $Ba_3NaGdNb_{10}O_{30}$, $Ba_2Na_3YNb_{10}O_{30}$, $Ba_2Na_3GdNb_{10}O_{30}$, $Ba_2Na_3LaNb_{10}O_{30}$, $Ba_2Na_3EuNb_{10}O_{30}$, $(Ba, Sr)Nb_2O_6$, $Cd_2Nb_2O_6$, $Sr_2Ta_2O_7$, $Co_3B_7O_{13}I$, SbSI, SbSBr, $Rb_2ZnCl_4$ or $Rb_2ZnBr_4$ or a solid solution consisting of an arbitrary combination of these materials, for example.

The conductor having a nonlinear field dependency of a current or an element having a nonlinear voltage dependency of a current employed for the nonlinear element 2 can be prepared from a varistor, a diode or a tunnel oxide film applied to a flash memory, for example. The varistor may be prepared from any of a sintered body type varistor such as a silicon carbide varistor or a zinc oxide varistor and a diode type varistor such as a pn diode or a Schottky diode, for example.

Figure 27:
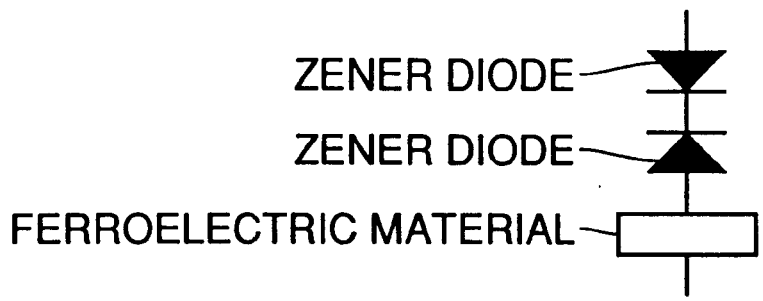
FIG. 27 illustrates a ferroelectric material and Zener diodes connected with each other.
Figure 28:
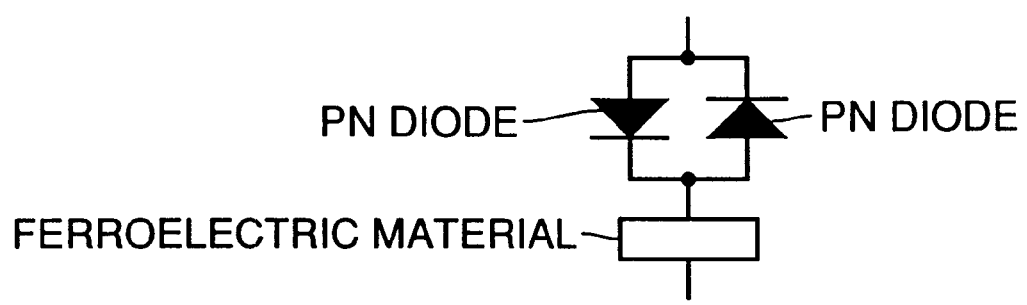
FIG. 28 illustrates a ferroelectric material and pn diodes.

When preparing the nonlinear element 2 from a Zener diode, nonlinearity for positive and negative drive voltages is required and hence two Zener diodes must be serially connected to a ferroelectric material as shown in FIG. 27. When preparing the nonlinear element 2 from a pn diode, nonlinearity for positive and negative drive voltages is required and hence two pn diodes arranged in parallel with each other must be serially connected to a ferroelectric material as shown in FIG. 28.

Figure 29:
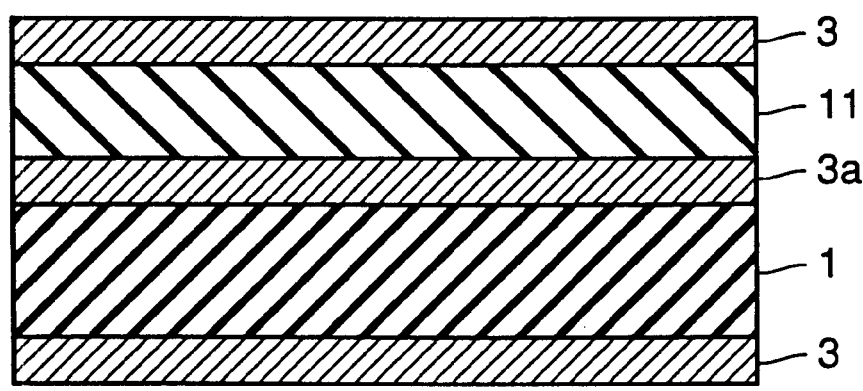
FIG. 29 is a schematic sectional view showing a structure employing a varistor as the nonlinear element.

When preparing the nonlinear element 2 from a varistor, it is preferable to hold a structure provided with an intermediate electrode 3a held between a ferroelectric film 1 and a varistor 11 between a pair of electrodes 3, as shown in FIG. 29.

Two or more nonlinear elements 2 may be used in combination, to attain an effect similar to the above. In this case, the two or more nonlinear elements 2 may hold the ferroelectric film 1 therebetween.

(Second Embodiment)

A nonvolatile semiconductor memory device according to a second embodiment of the present invention has a structure identical to that shown in FIG. 1, and a nonlinear element 2 thereof has a double hysteresis characteristic as shown in FIG. 3.

Figure 30:
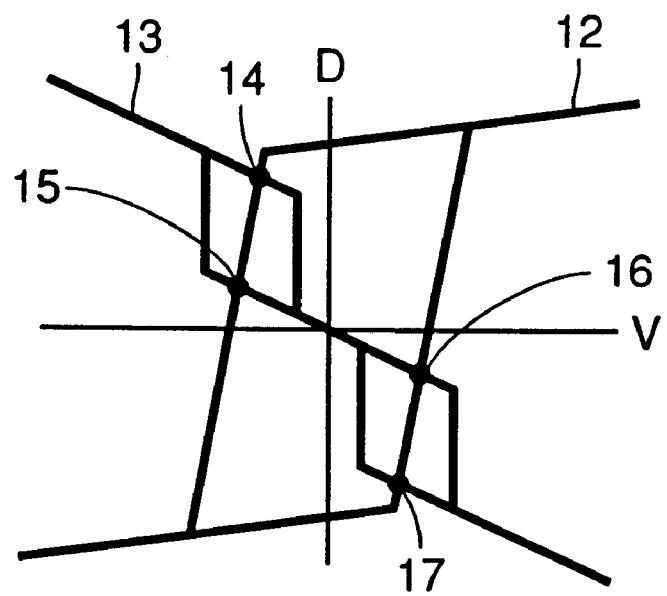
FIG. 30 is a diagram for illustrating four intersection points between characteristic curves of a ferroelectric film and a nonlinear element.

When a pair of electrodes 3 are supplied with no potential in this structure, it follows that D-V characteristic curves 12 and 13 of a ferroelectric film 1 and the nonlinear element 2 intersect with each other at four points 14 to 17, as shown in FIG. 30. Thus, four stable states in electric displacement are present as shown in Table 1 due to the presence of the four intersection points 14 to 17, and four values can be stored in a single FRAM memory cell.

TABLE 1

| Intersection | Ferroelectric Material | | Antiferroelectric Material | |
|---|---|---|---|---|
| Point | Polarization | Voltage | Polarization | Voltage |
| 14 | up | − | up | + |
| 15 | up | − | +low | + |
| 16 | down | + | −low | − |
| 17 | down | + | down | − |

Figure 31:
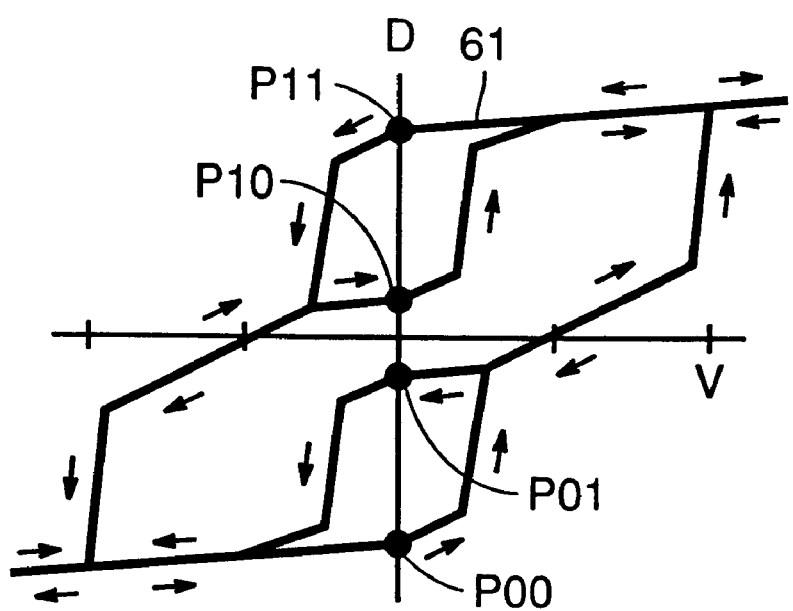
FIG. 31 illustrates a composite hysteresis characteristic of the ferroelectric film and the nonlinear element.
Figure 32:
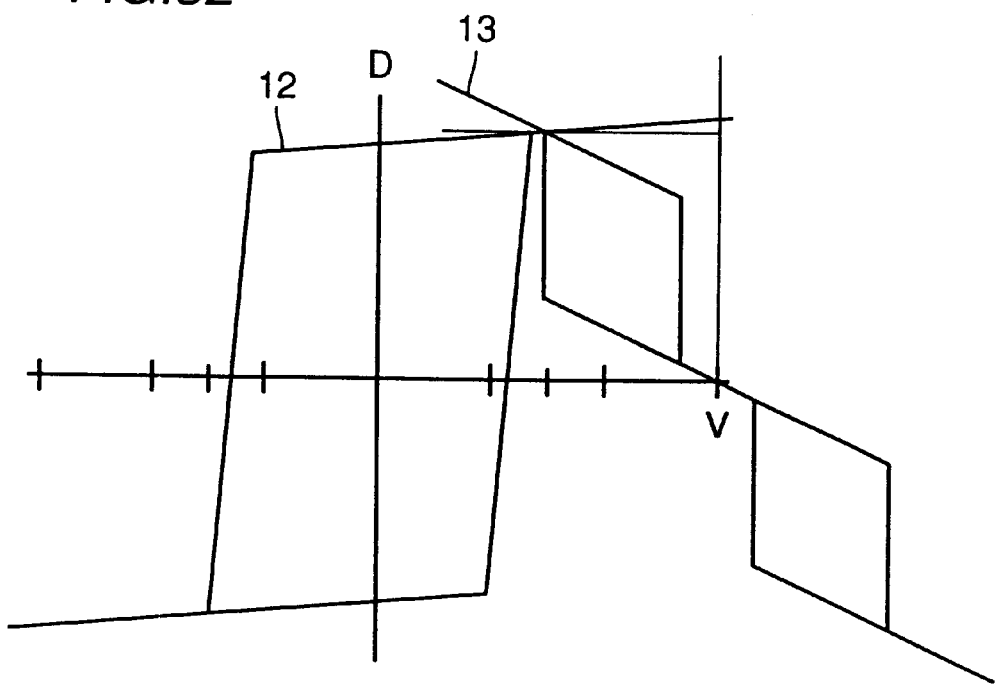
FIGS. 32 to 51 successively illustrate plots of the composite hysteresis characteristic of the ferroelectric film and the nonlinear element.
Figure 33:
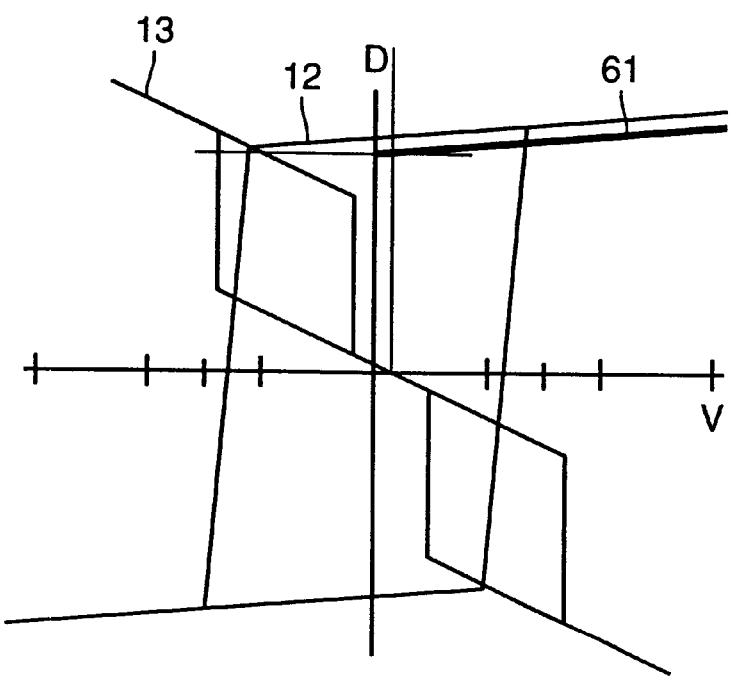
Figure 34:
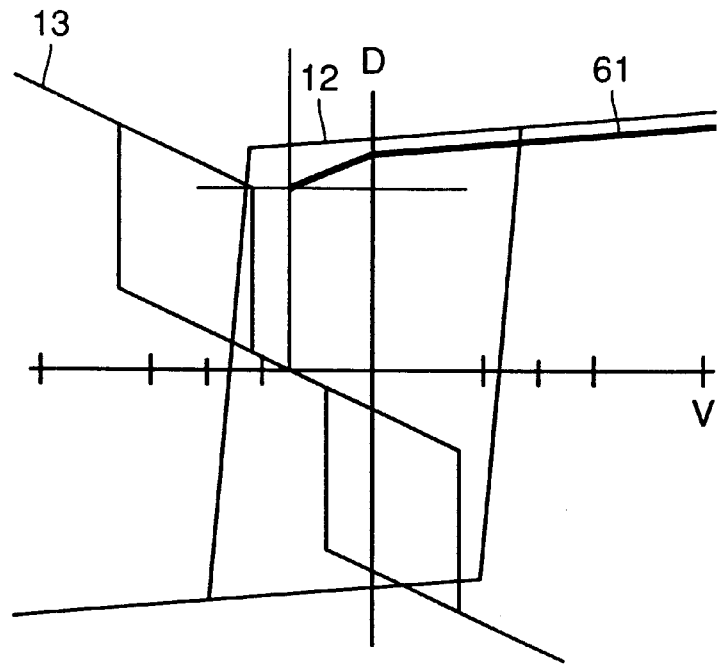
Figure 35:
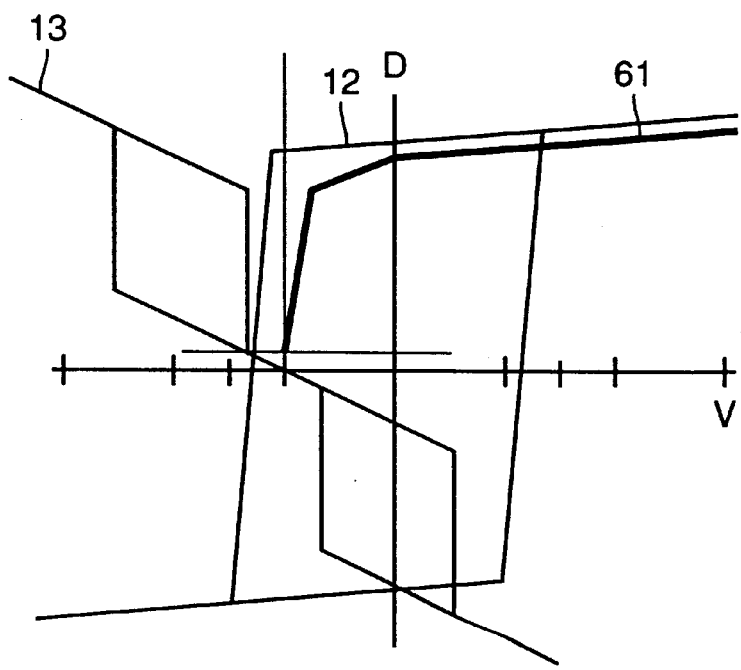
Figure 36:
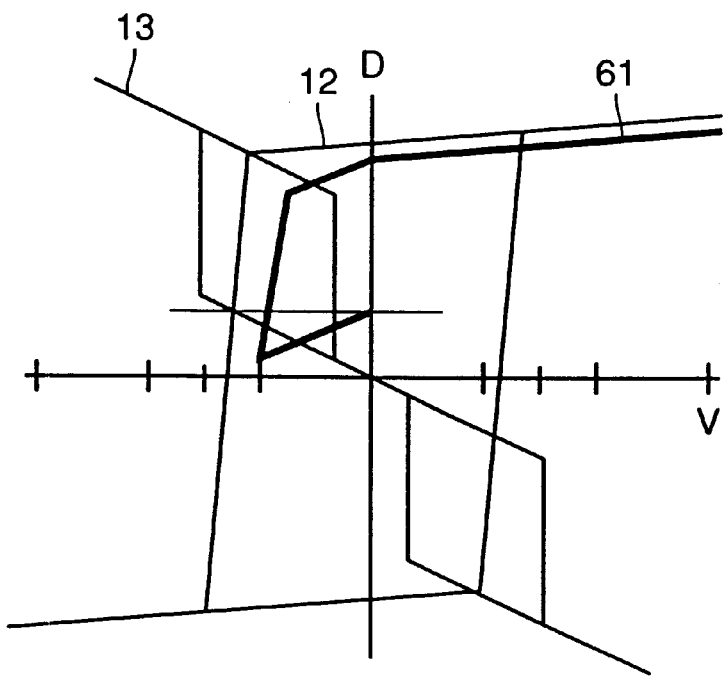
Figure 37:
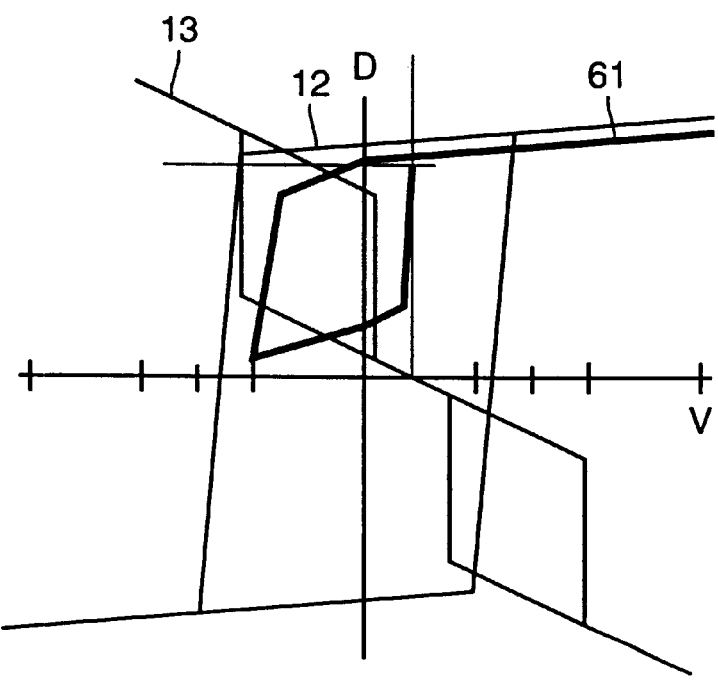
Figure 38:
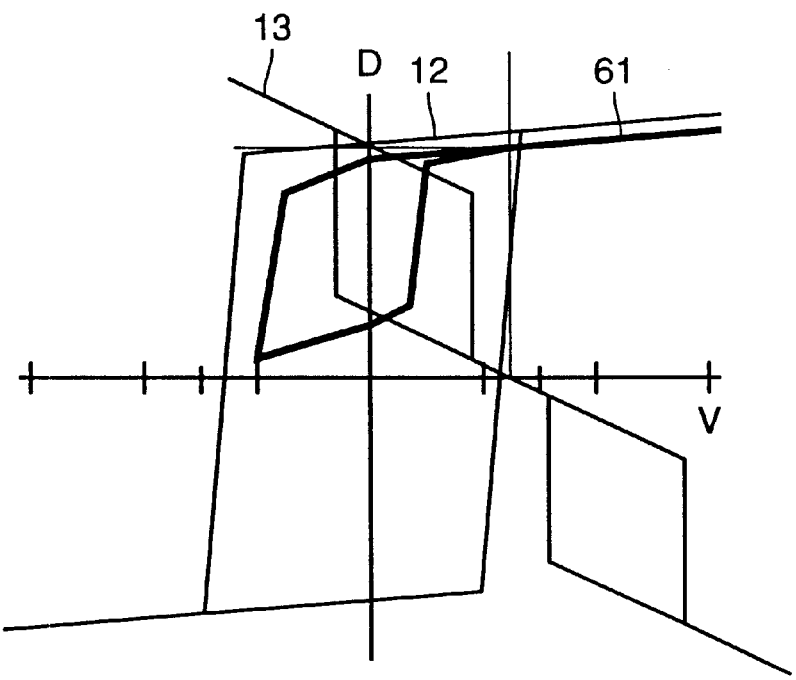
Figure 39:
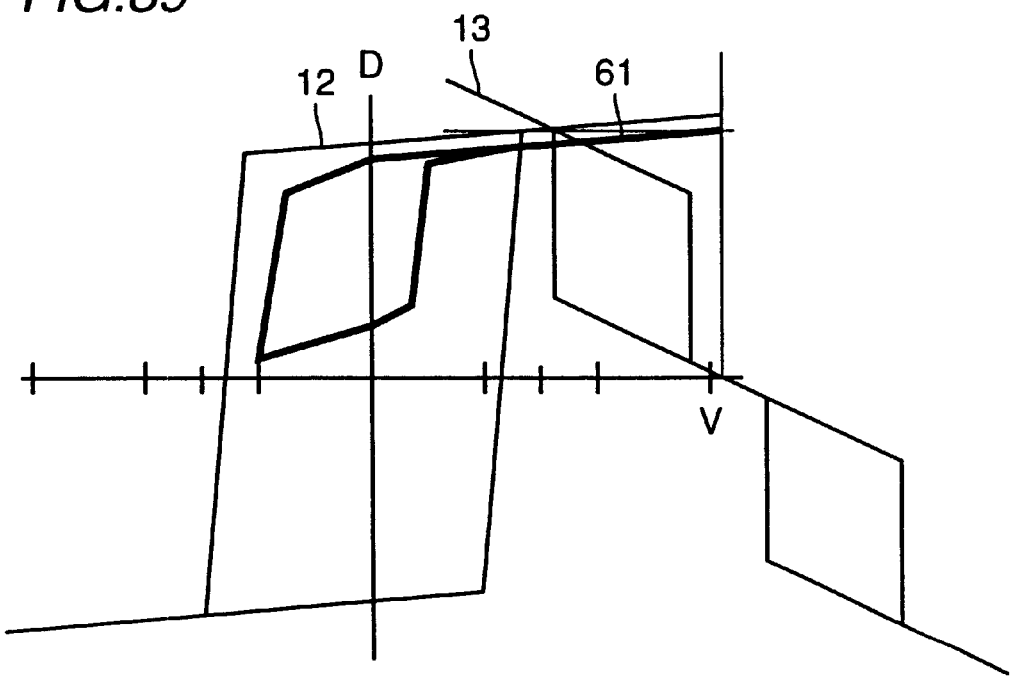
Figure 40:
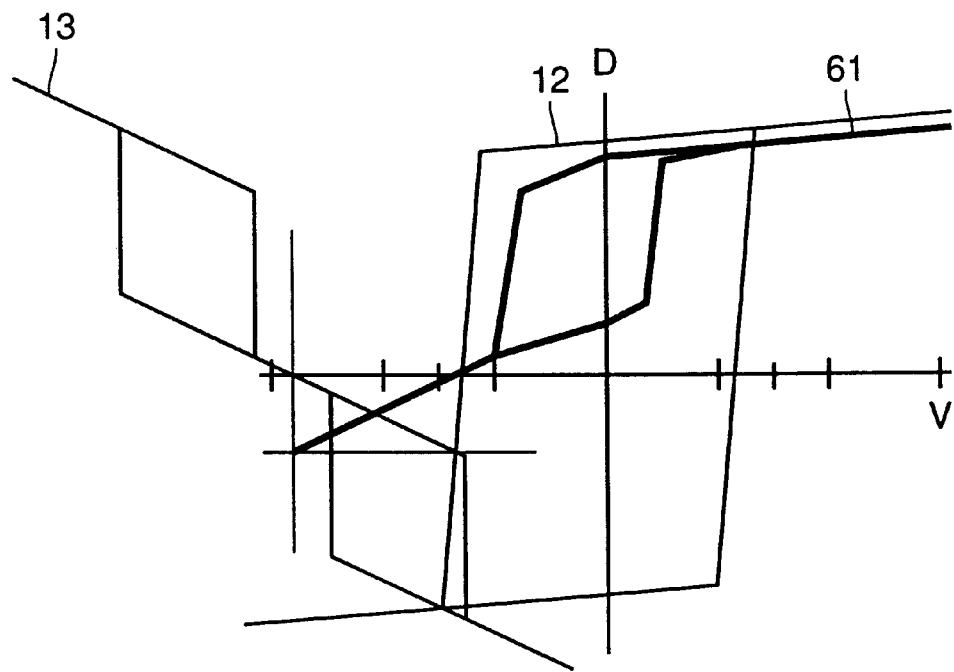
Figure 41:
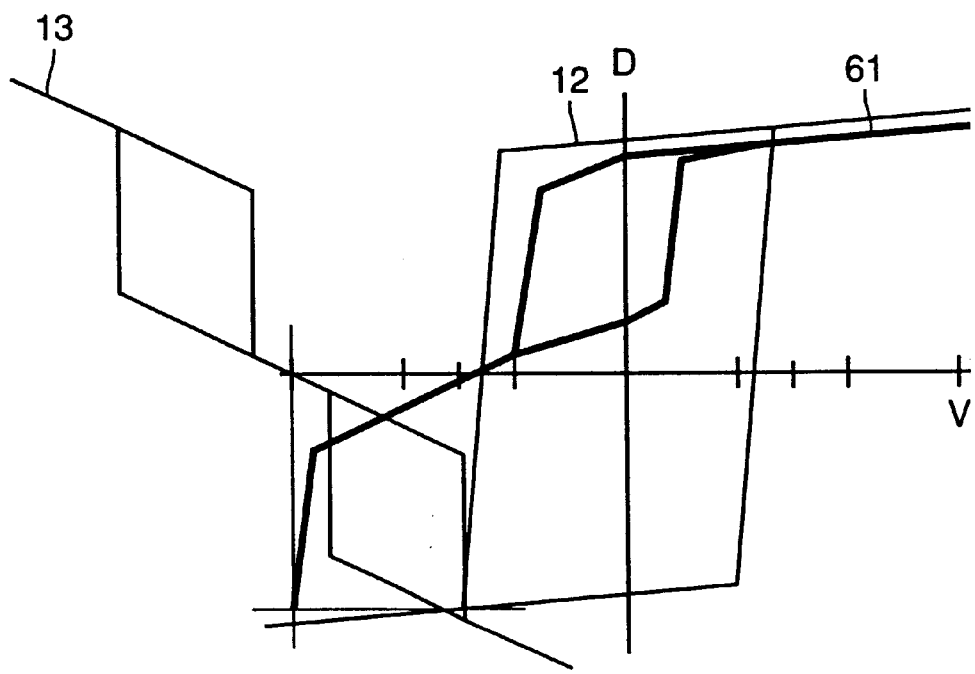
Figure 42:
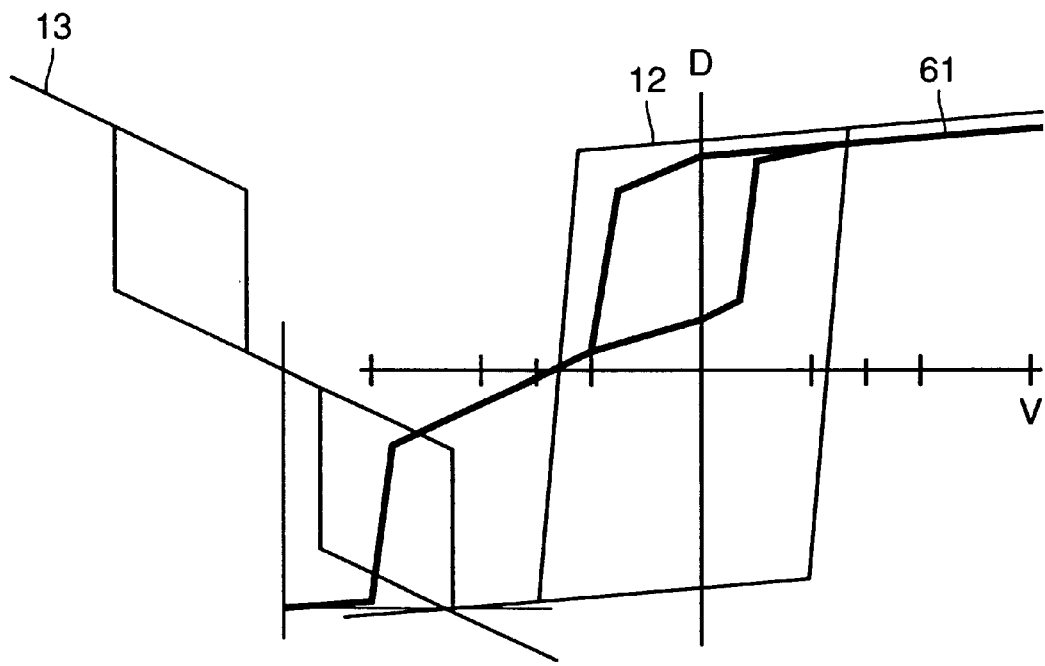
Figure 43:
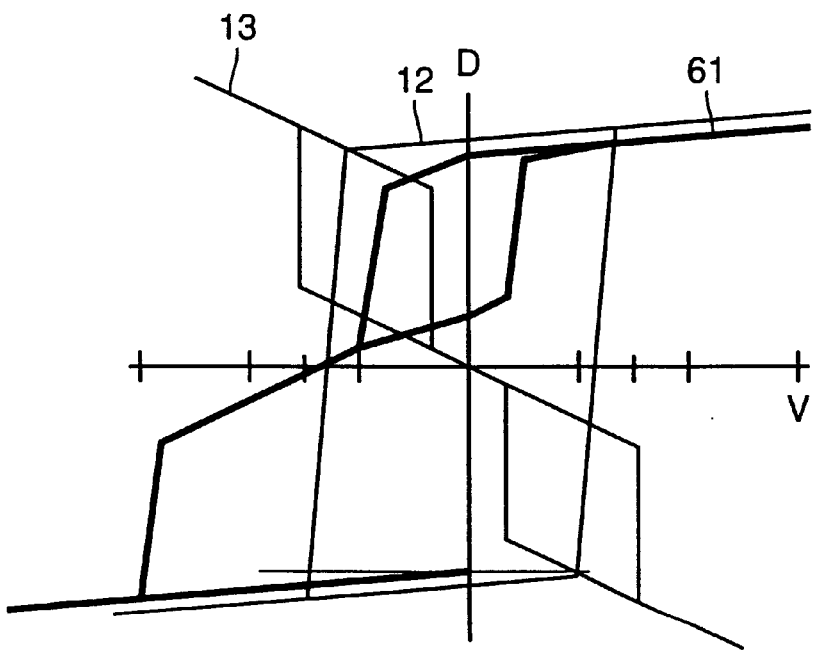
Figure 44:
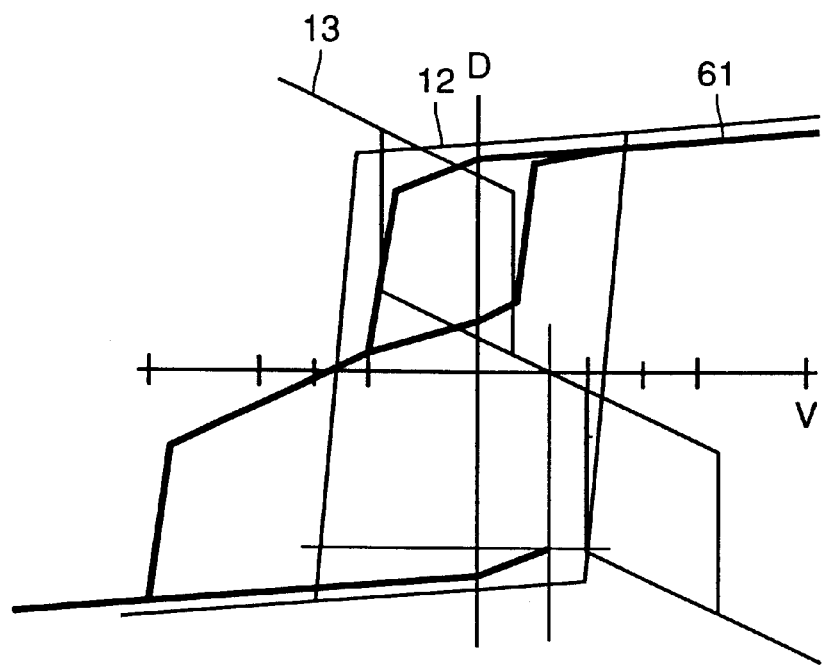
Figure 45:
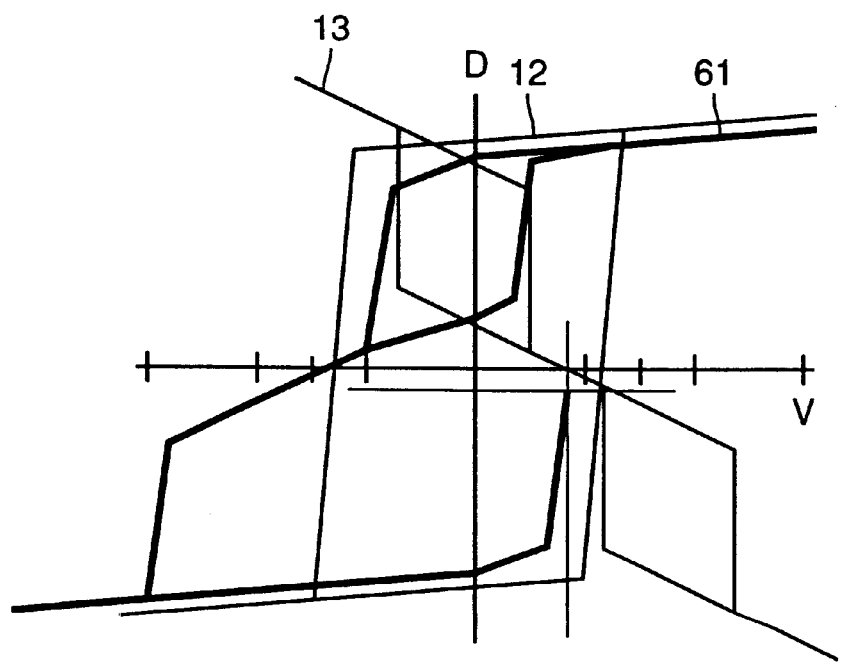
Figure 46:
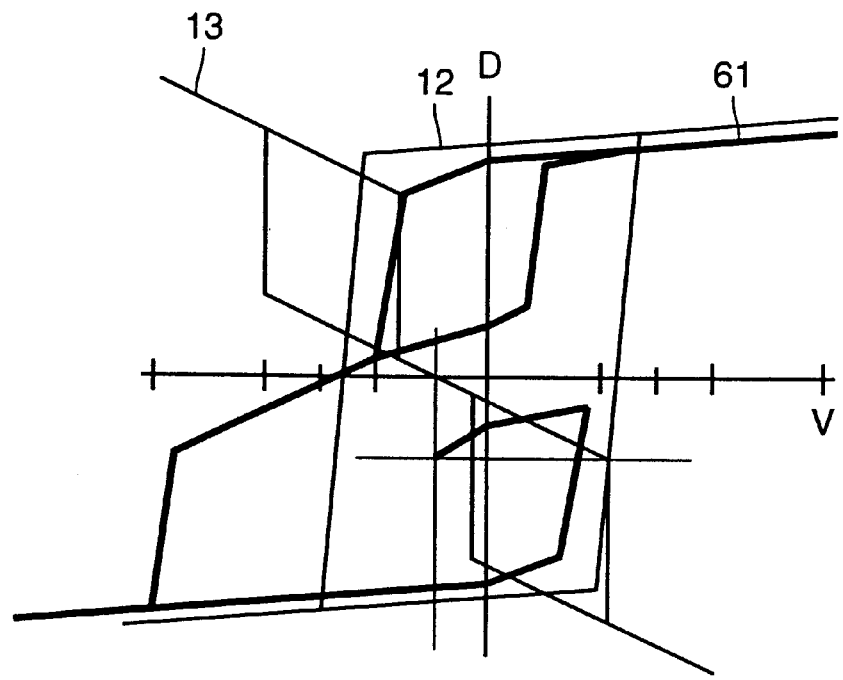
Figure 47:
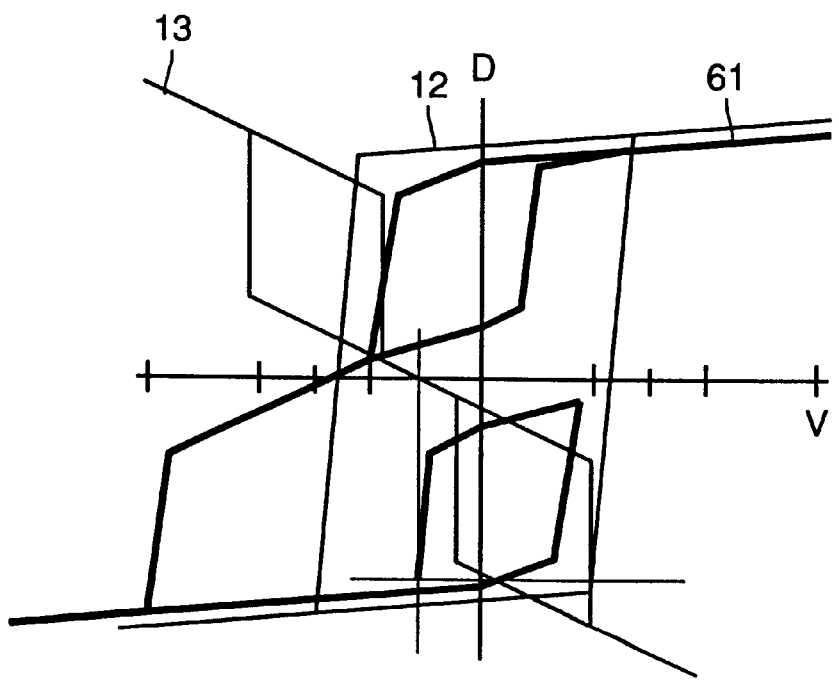
Figure 48:
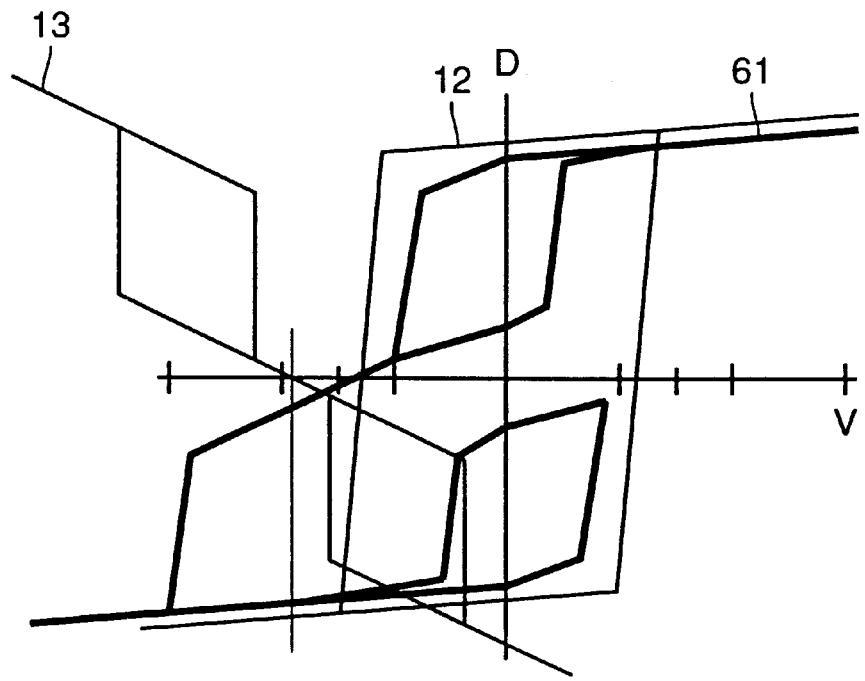
Figure 49:
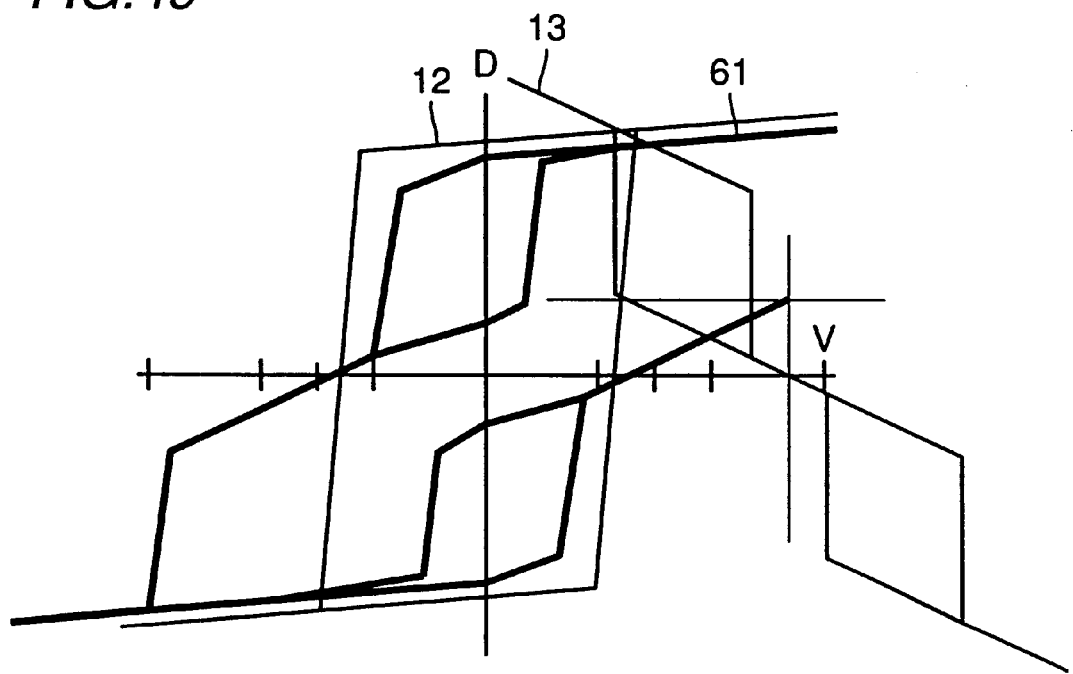
Figure 50:
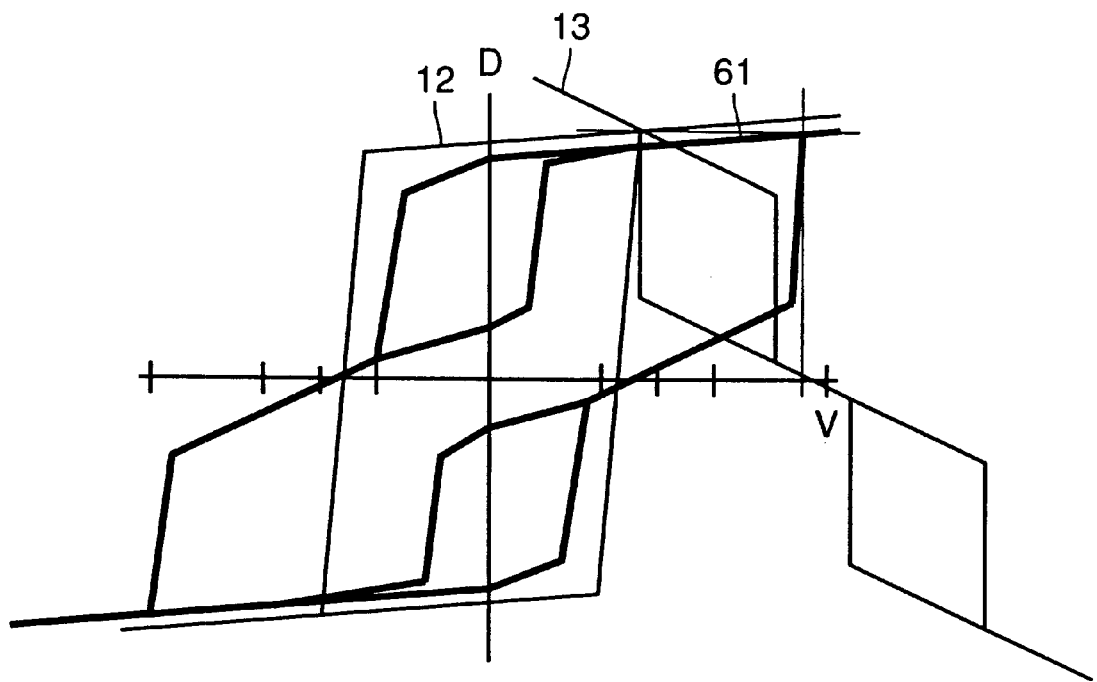
Figure 51:
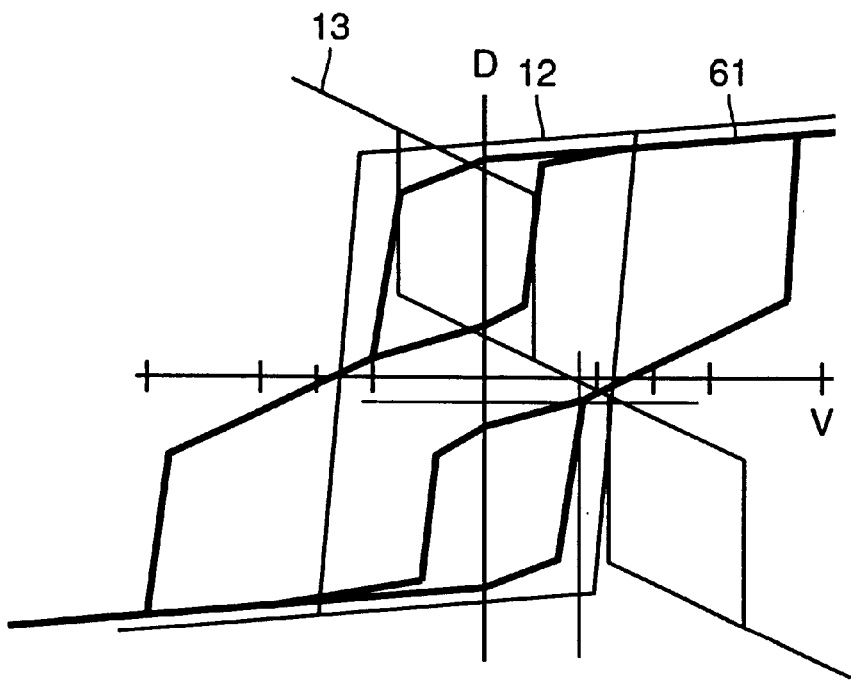

FIG. 31 shows a composite hysteresis characteristic 61 of the relation between an electric flux density D and an applied voltage V0 in the case of the characteristics shown in FIG. 30 obtained by plots similar to those in FIGS. 10 to 18 and 19 to 23. FIGS. 32 to 51 show these plots.

The composite hysteresis characteristic 61 shown in FIG. 31 has four paths. It follows that four stable points P11, P01, P10 and P00 shown in Table 1 are expressed in respective points with reference to the applied voltage V0 of 0 V in the composite hysteresis characteristic 61.

A method of writing four-valued stored information is now described.

Figure 52A:
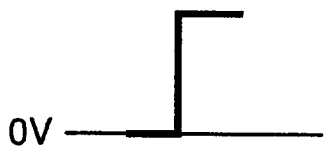
FIGS. 52A and 52B successively illustrate voltage patterns in P11 writing.
Figure 52B:
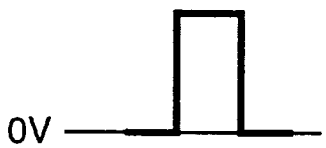
Figure 53A:
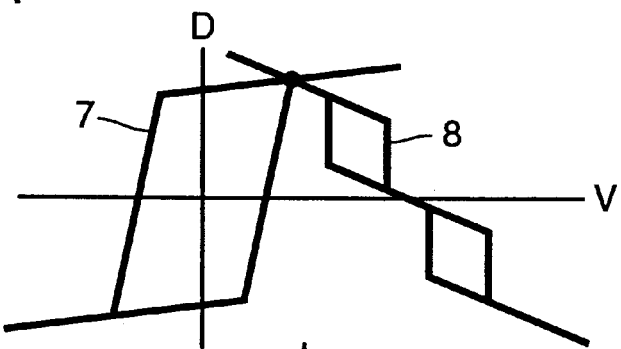
FIGS. 53A and 53B successively illustrate the states of characteristic curves corresponding to the voltage patterns shown in FIGS. 52A and 52B respectively.
Figure 53B:
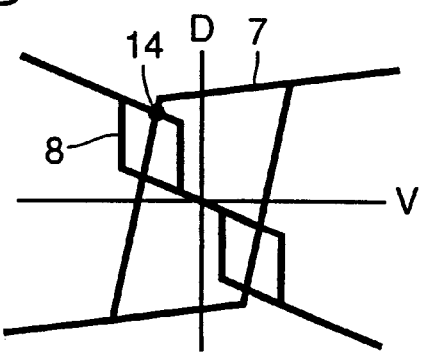

As to writing in the state P11, a relatively large positive voltage is applied across electrodes 3, as shown in FIG. 52A. In this state, a characteristic curve 8 of the nonlinear element 2 is located on a position separate from the origin by the applied voltage along the positive direction of the x axis, as shown in FIG. 53A. When the voltage applied across the electrodes 3 is set to 0 V from this state as shown in FIG. 52B, the characteristic curve 8 of the nonlinear element 2 moves to the origin as shown in FIG. 53B. Thus, writing in the state P11 is performed on the intersection point 14.

Figure 54A:
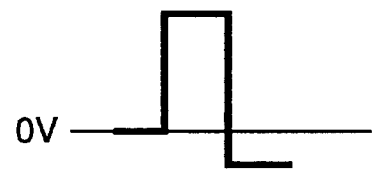
FIGS. 54A and 54B successively illustrate voltage patterns in P10 writing.
Figure 54B:
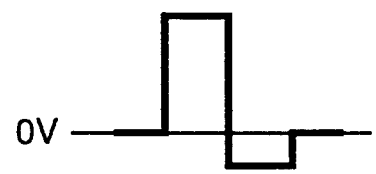
Figure 55A:
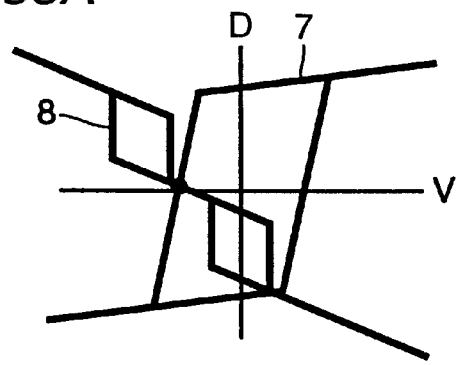
FIGS. 55A and 55B successively illustrate the states of characteristic curves corresponding to the voltage patterns shown in FIGS. 54A and 54B respectively.
Figure 55B:
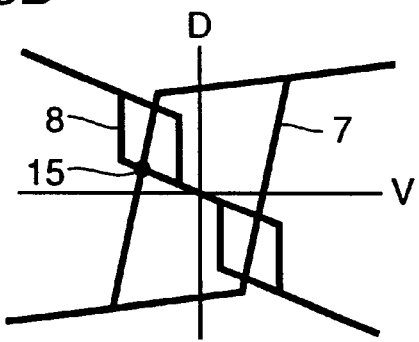

As to writing in the state P10, a relatively large positive voltage is applied across the electrodes 3, followed by application of a relatively small negative voltage, as shown in FIG. 54A. In this state, the characteristic curve 8 of the nonlinear element 2 slightly moves from the origin by the applied voltages along the negative direction of the x axis, as shown in FIG. 55A. When the voltage applied across the electrodes 3 is set to 0 V from this state as shown in FIG. 54B, the characteristic curve 8 of the nonlinear element 2 moves to the origin as shown in FIG. 55B. Thus, writing in the state P10 is performed on the intersection point 15. In this case, the hysteresis characteristic of the ferroelectric material insufficiently sweeps the voltage and hence follows an inner loop (not shown). While the shape of the inner loop depends on the ferroelectric material and the value of the second applied voltage, it follows that the electric flux density after the writing in the P10 (P01) state takes almost the same value as the intersection point 15 shown in FIG. 55B or a small positive (negative) value in any case.

Figure 56A:
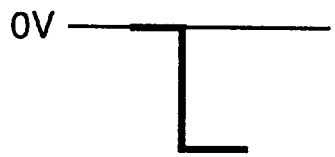
FIGS. 56A and 56B successively illustrate voltage patterns in P00 writing.
Figure 56B:
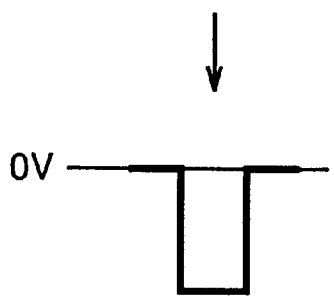
Figure 57A:
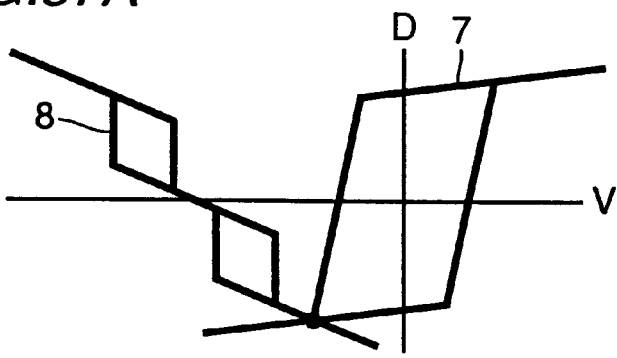
FIGS. 57A and 57B successively illustrate the states of characteristic curves corresponding to the voltage patterns shown in FIGS. 56A and 56B respectively.
Figure 57B:
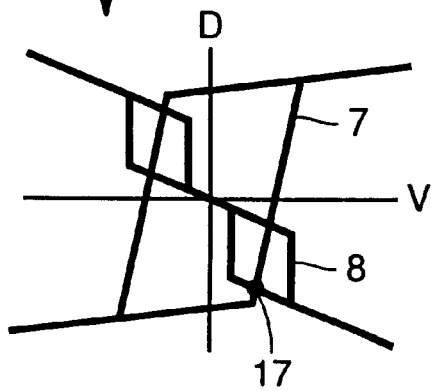

As to writing in the state P00, a relatively large negative voltage is applied across the electrodes 3, as shown in FIG. 56A. In this state, the characteristic curve 8 of the nonlinear element 2 is located on a position separate from the origin by the applied voltage along the negative direction of the x axis, as shown in FIG. 57A. When the voltage applied across the electrodes 3 is set to 0 V from this state as shown in FIG. 56B, the characteristic curve 8 of the nonlinear element 2 moves to the origin as shown in FIG. 57B. Thus, writing in the state P00 is performed on the intersection point 17.

Figure 58A:
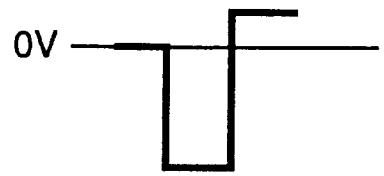
FIGS. 58A and 58B successively illustrate voltage patterns in P01 writing.
Figure 58A:
Figure 58B:
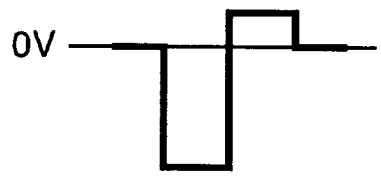
Figure 59A:
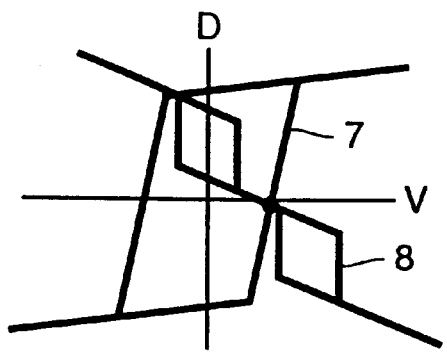
FIGS. 59A and 59B successively illustrate the states of characteristic curves corresponding to the voltage patterns shown in FIGS. 58A and 58B respectively.
Figure 59B:
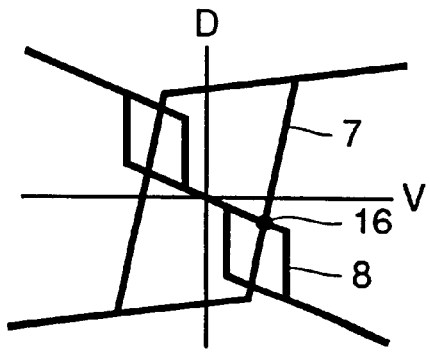

As to writing in the state P01, a relatively large negative voltage is applied across the electrodes 3 followed by application of a relatively small positive voltage, as shown in FIG. 58A. In this state, the characteristic curve 8 of the nonlinear element 2 slightly moves from the origin by the applied voltages along the positive direction of the x axis, as shown in FIG. 59A. When the voltage applied across the electrodes 3 is set to 0 V from this state as shown in FIG. 58B, the characteristic curve 8 of the nonlinear element 2 moves to the origin as shown in FIG. 59B. Thus, writing in the P01 state is performed on the intersection point 16. In this case, the hysteresis characteristic of the ferroelectric material insufficiently sweeps the voltage and hence follows an inner loop (not shown). While the shape of the inner loop depends on the ferroelectric material and the value of the second applied voltage, it follows that the electric flux density after the writing in the state P10 (P01) state takes almost the same value as the intersection point 15 shown in FIG. 59B or a small positive (negative) value in any case.

Thus, writing in the states P11, P10, P01 and P00 can be performed by applying pairs of voltage pulses having different values to the ferroelectric film 1 and the nonlinear element 2, so that four values can be stored in a single FRAM memory cell.

Each of the structures according to the aforementioned first and second embodiments can be applied to both DRAM and FET type FRAM memory cells.

Figure 60:
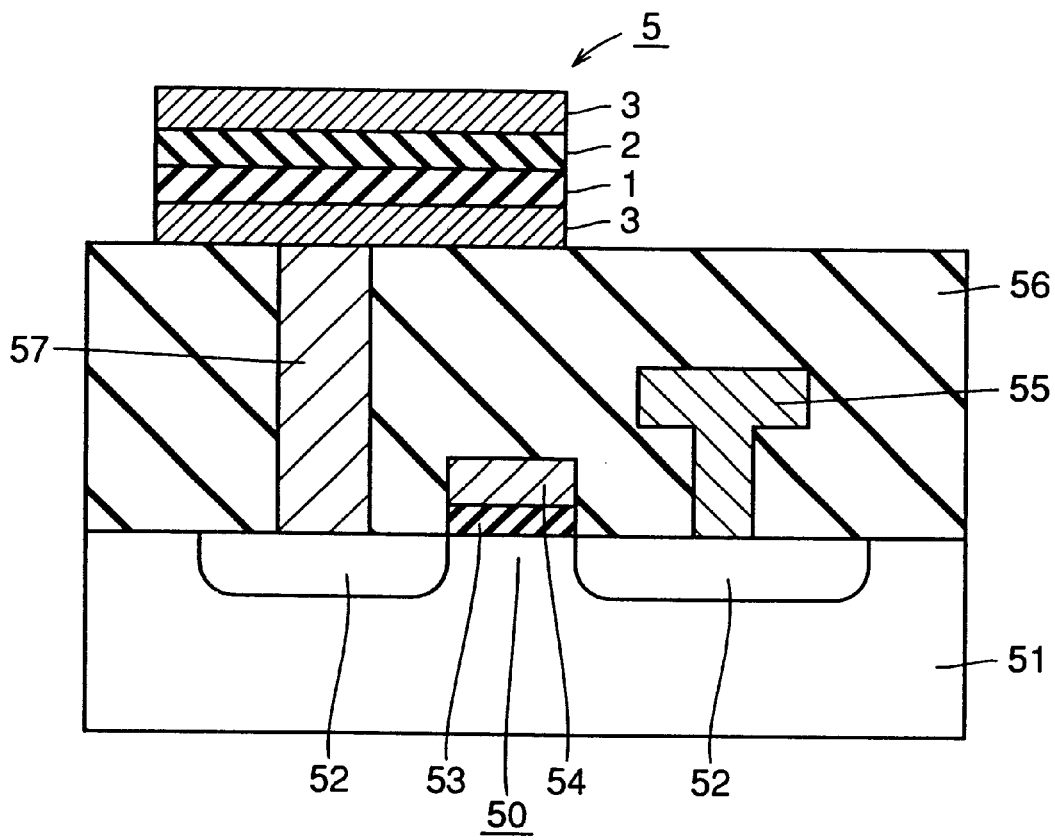
FIG. 60 is a schematic sectional view showing the structure of FIG. 1 applied to a DRAM type FRAM memory cell.

Referring to FIG. 60, a DRAM type memory cell has a switching transistor 50 and a ferroelectric capacitor 5. The switching transistor 50 has a pair of source/drain regions 52 formed on the surface of a silicon substrate 51 and a gate electrode layer 54 formed on a region held between the pair of source/drain regions 52 through a gate insulating layer 53.

A bit line 55 is electrically connected to one of the source/drain regions 52 of the switching transistor 50. An interlayer isolation layer 56 is formed on the overall surface of the silicon substrate 51 to cover the switching transistor 50, the bit line 55 and the like.

The ferroelectric capacitor 5 has a ferroelectric film 1 and a nonlinear element 2 held between a pair of electrodes 3, similarly to the structure shown in FIG. 1. One of the pair of electrodes 3 is electrically connected to the other one of the source/drain regions 52 of the switching transistor 50 through a plug layer 57, for example.

While the ferroelectric film 1 is provided as a lower layer and the nonlinear element 2 is provided as an upper layer in the aforementioned ferroelectric capacitor 5, the ferroelectric film 1 and the nonlinear element 2 may alternatively be provided as upper and lower layers respectively.

Figure 61:
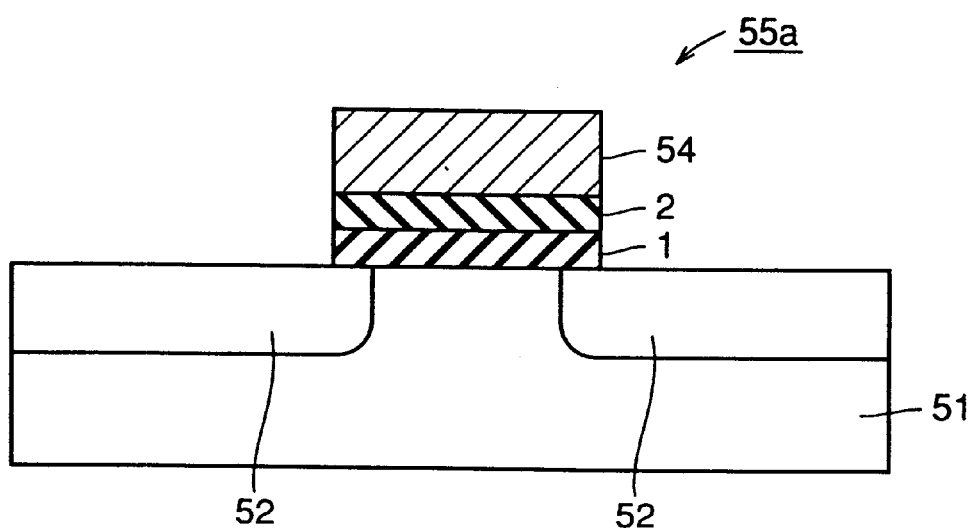
FIG. 61 is a schematic sectional view showing the structure of FIG. 1 applied to an MFSFET type FRAM memory cell.

Referring to FIG. 61, an MFSFET 55a has a pair of source/drain regions 52 formed on the surface of a silicon substrate 51 and a gate electrode layer 54 formed on a region held between the pair of source/drain regions 52 through a ferroelectric film 1 and a nonlinear element 2.

When the silicon substrate 51 and the ferroelectric film 1 are in direct contact with each other, a trap level on the surface of the silicon substrate 51 cannot be controlled and much difficulty is predicted in relation to stable operations of the transistor. Therefore, an additional insulator film such as a silicon oxide film may be provided between the silicon substrate 51 and the ferroelectric film i. In place of employing such an additional film, the positions of the ferroelectric film 1 and the nonlinear element 2 may be exchanged. In other words, the nonlinear element 2 may be formed to be in contact with the surface of the silicon substrate 51, and the ferroelectric film 1 may be formed between the nonlinear element 2 and the gate electrode layer 54.

Figure 62:
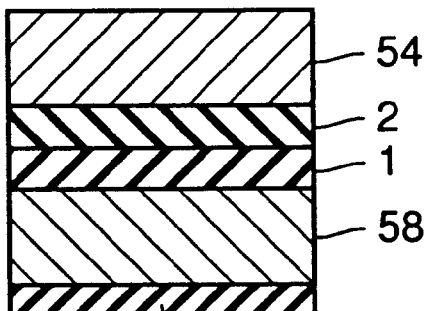
FIG. 62 is a schematic sectional view showing the structure of FIG. 1 applied to an MFMISFET type FRAM memory cell.

Referring to FIG. 62, an MFMISFET 55b has a pair of source/drain regions 52 formed on the surface of a silicon substrate 51, a floating gate electrode layer 58 formed on a region held between the pair of source/drain regions 52 through a gate insulating layer 53 and a control gate electrode layer 54 formed on the floating gate electrode layer 58 through a ferroelectric film 1 and a nonlinear element 2.

While the ferroelectric film 1 is provided as a lower layer and the nonlinear element 2 is provided as an upper layer in the aforementioned structure, the ferroelectric film 1 and the nonlinear element 2 may alternatively be provided as upper and lower layers respectively.

(Third Embodiment)

A third embodiment of the present invention relates to a nonvolatile semiconductor memory device capable of storing more than four values.

Figure 63:
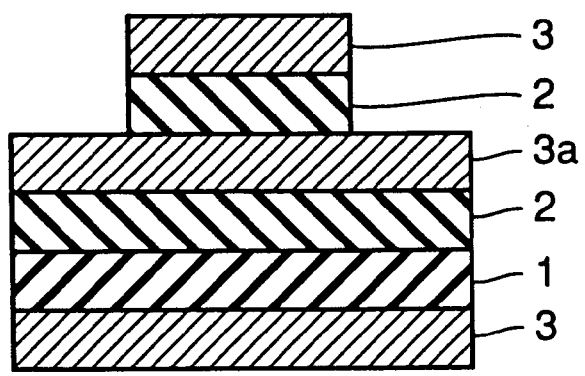
FIG. 63 is a sectional view schematically showing the structure of a nonvolatile semiconductor memory device according to a third embodiment of the present invention.

FIG. 63 illustrates a capacitor part implementing nonvolatile storage as a specific example of the third embodiment.

Referring to FIG. 63, the capacitor implementing nonvolatile storage according to this embodiment has a ferroelectric film 1, two nonlinear elements 2a and 2b, a pair of electrodes 3 and an intermediate electrode 3a. The ferroelectric film 1 has such a characteristic that the direction of spontaneous polarization is inverted when an electric field is externally applied to crystals having spontaneous polarization, and a dependency 7 in an electric field density D and voltage V draws a hysteresis loop by polarization inversion as shown in FIG. 2.

The nonlinear elements 2a and 2b are antiferroelectric materials, for example. The nonlinear elements 2a and 2b have such a characteristic that the quantity of increase of a positive electric flux density D with respect to an electric field E is small in a low field region below a threshold P and large in a high field region beyond the threshold P in a dependency of the electric flux density D and the electric field E, as shown in FIG. 3.

The nonlinear element 2a is directly connected with the ferroelectric film 1. The ferroelectric film 1 and the nonlinear element 2a are held between the intermediate electrode 3a and one of the electrodes 3, while the nonlinear element 2b is held between the intermediate electrode 3a and the other one of the electrodes 3.

The ferroelectric film 1 and the nonlinear element 2a exhibit a composite D-V hysteresis characteristic similar to the hysteresis loop shown in FIG. 31. The nonlinear element 2b has a double hysteresis characteristic different from that of the nonlinear element 2a.

Figure 64:
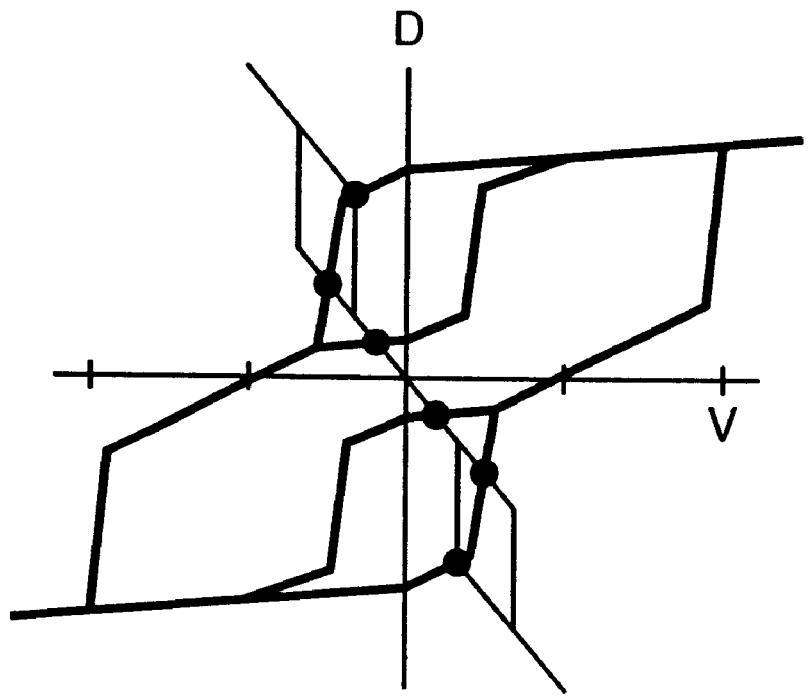
FIG. 64 illustrates a composite hysteresis of a ferroelectric film and a nonlinear element and a double hysteresis of the nonlinear element together.
Figure 65:
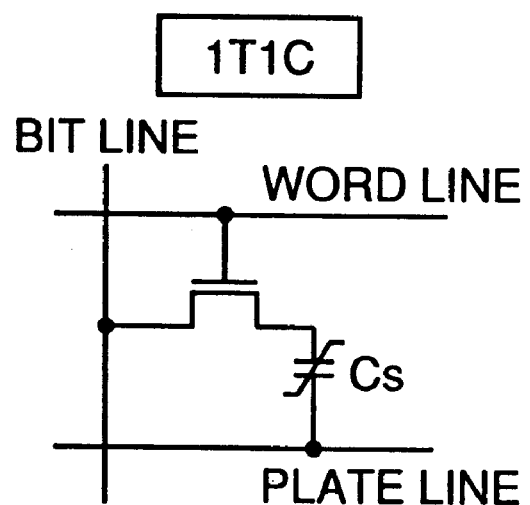
FIG. 65 is a circuit diagram showing a DRAM type 1T1C FRAM memory cell structure.
Figure 66:
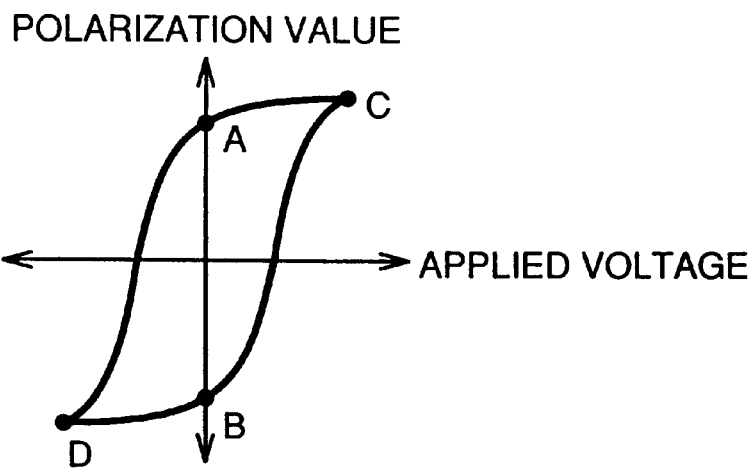
FIG. 66 is a diagram for illustrating polarization inversion of a ferroelectric material.
Figure 67:
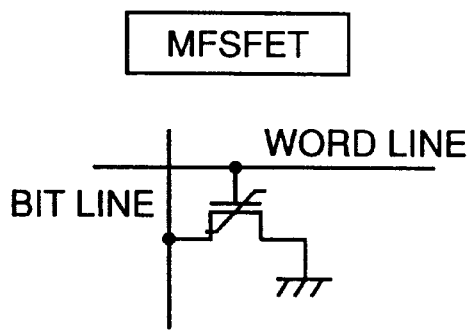
FIG. 67 is a circuit diagram showing an MFSFET type FRAM memory cell structure.
Figure 68:
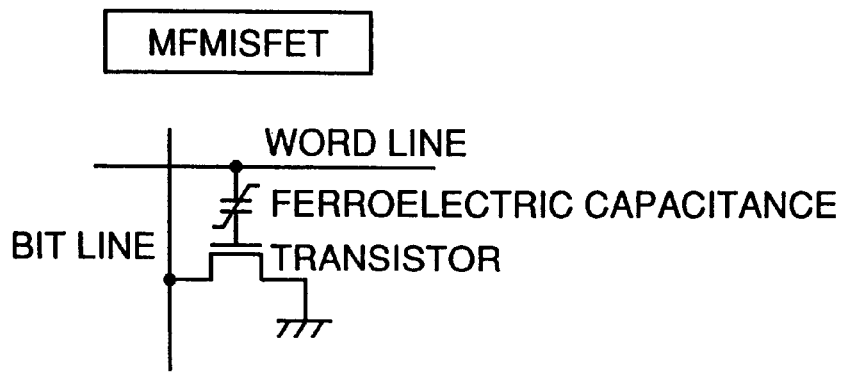
FIG. 68 is a circuit diagram showing an MFMISFET type FRAM memory cell structure.
Figure 69:
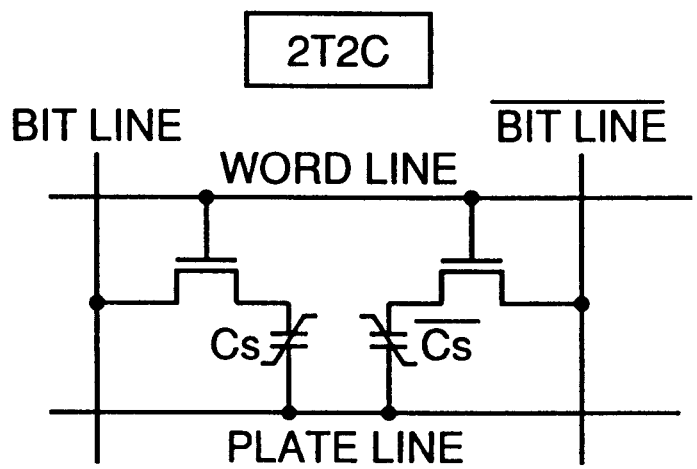
FIG. 69 is a circuit diagram showing a DRAM type 2T2C FRAM memory cell structure.
Figure 70:
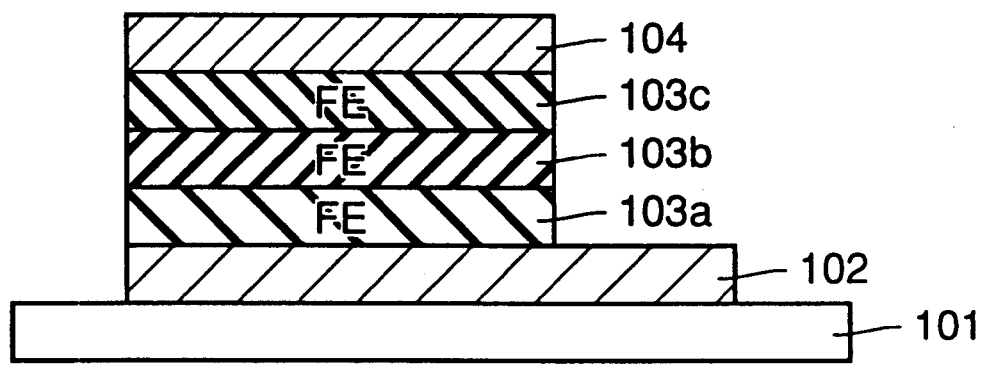
FIG. 70 illustrates a multilayer structure of a ferroelectric material disclosed in Japanese Patent Laying-Open No. 5-259391.
Figure 71A:
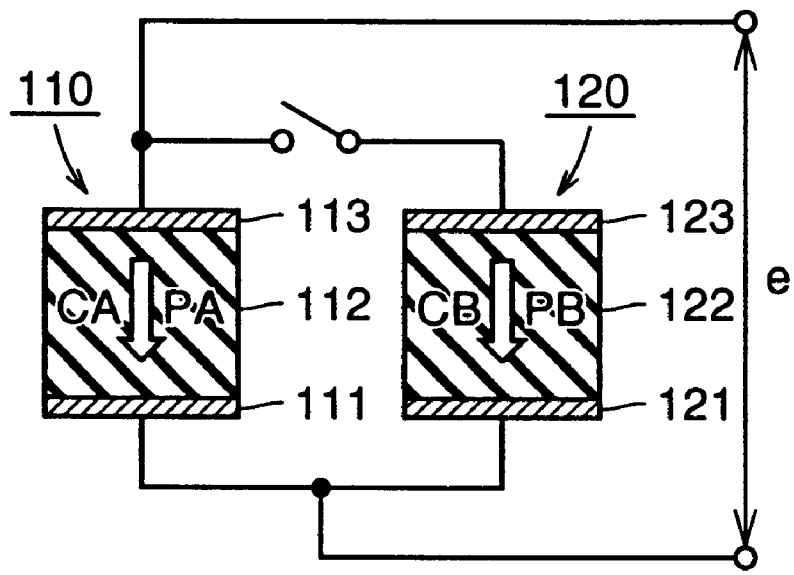
FIGS. 71A and 71B illustrate structures obtained by connecting ferroelectric capacitors in parallel and series with each other respectively disclosed in Japanese Patent Laying-Open No. 6-14380.
Figure 71B:
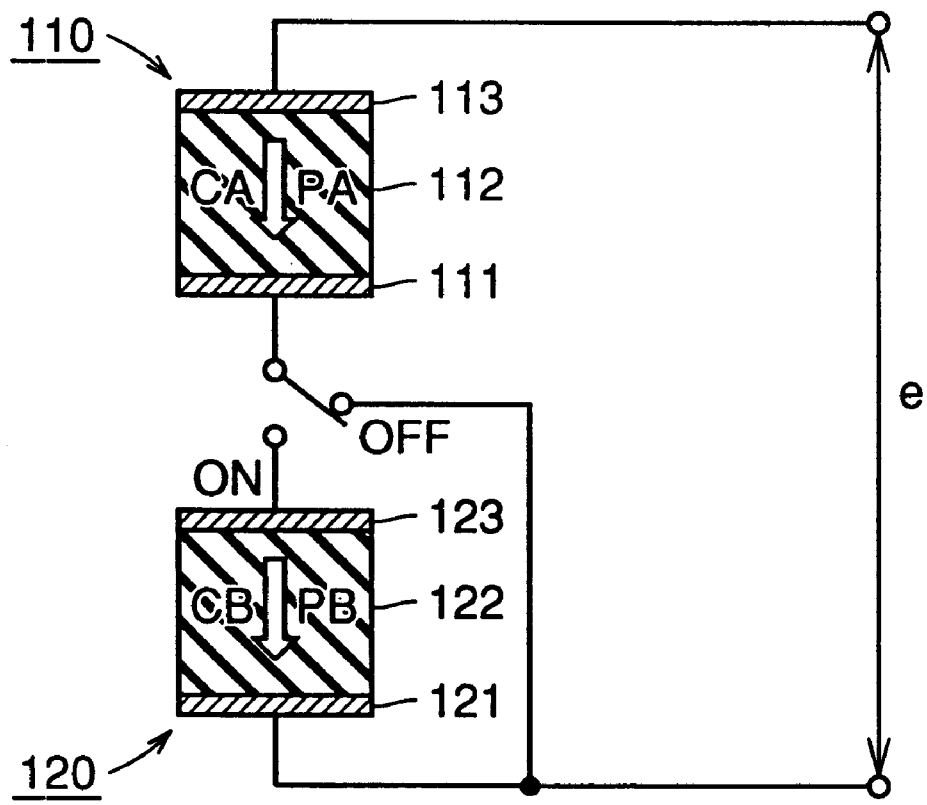
Figure 72:
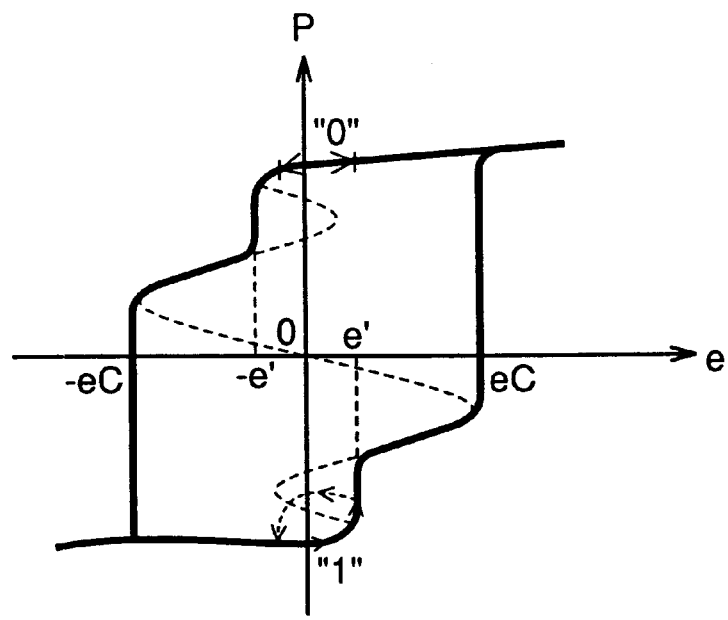
FIG. 72 illustrates a composite hysteresis of the two ferroelectric capacitors shown in FIGS. 71A or 71B.
Figure 73:
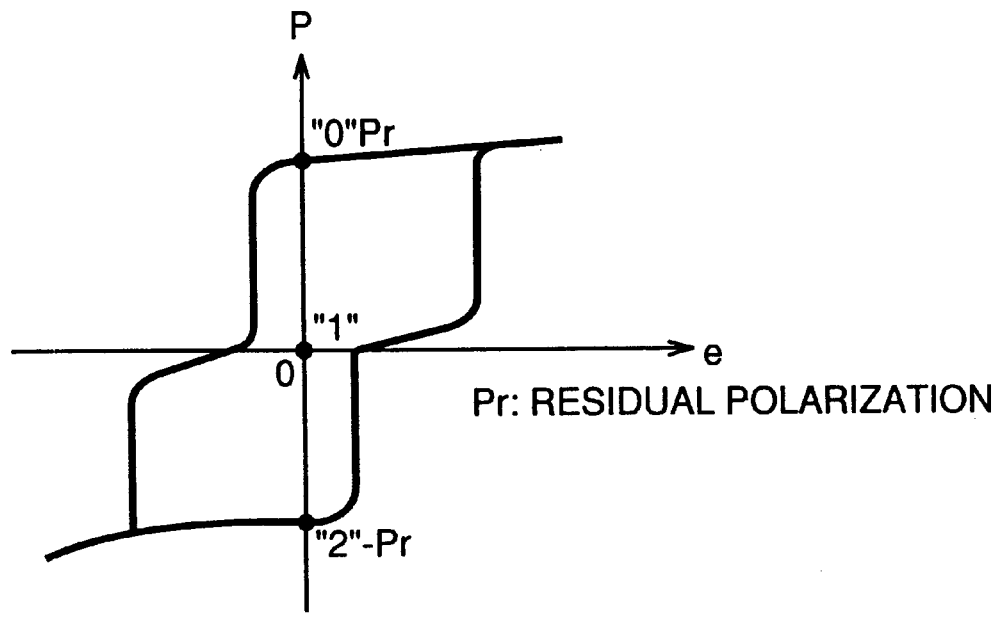
FIG. 73 is a diagram for illustrating a state of storing three values from the composite hysteresis.

When no potential is supplied across the electrodes 3, therefore, it follows that the composite hysteresis loop 61 of the ferroelectric film 1 and the nonlinear element 2a and the double hysteresis characteristic 62 of the nonlinear element 2b intersect with each other at six points, as shown in FIG. 64. Thus, six stable states in electric displacement are present due to the presence of the six intersection points, and six values can be stored in a single FRAM memory cell.

Pairs of voltage pulses having different values are employed for writing six-valued stored information, similarly to the case of the four values. Three positive levels and three negative levels are sufficient as the values of the pulse voltages.

The second embodiment employs a single nonlinear element having a double hysteresis characteristic and the third embodiment employs two nonlinear elements having double hysteresis characteristics, thereby implementing four-valued nonvolatile storage and six-valued nonvolatile storage respectively. A multivalued nonvolatile memory device storing eight, ten or more values can be obtained by employing additional nonlinear elements.

The structure (FIG. 63) according to the third embodiment is applicable not only to the DRAM type cell shown in FIG. 60 but also to the MFSFET shown in FIG. 61 or the MFMISFET shown in FIG. 62. The ferroelectric film 1 and the nonlinear elements 2a and 2b may be prepared from the materials or elements described with reference to the first embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device rewriting stored information with a quantity of charges of a dielectric material, comprising:
    a ferroelectric film having a hysteresis characteristic dependent on an electric flux density D and an electric field E; and
    a nonlinear element having a double hysteresis characteristic electrically connected with said ferroelectric film and having at least either a characteristic that (a) the quantity of increase of a positive electric flux density D with respect to the electric field E is small in a low electric field region and large in a high electric field region in accord with a dependency between electric field density D and electric field E, or (b) the quantity of increase of a positive current I is small in a low electric field or low voltage region and large in a high electric field or high voltage region in accord with a dependency between current I and electric field E or an applied voltage.

2. The nonvolatile semiconductor memory device according to claim 1, wherein said nonlinear element is a dielectric material having a double hysteresis characteristic.

3. The nonvolatile semiconductor memory device according to claim 2, wherein said nonlinear element is an antiferroelectric material.

4. The nonvolatile semiconductor memory device according to claim 2, wherein said nonlinear element is a ferroelectric material in a paraelectric phase.

5. The nonvolatile semiconductor memory device according to claim 2, capable of storing at least four values.

6. The nonvolatile semiconductor memory device according to claim 5, having a structure capable of applying at least two voltage pulses of different values to said ferroelectric film and said nonlinear element.

7. The nonvolatile semiconductor memory device according to claim 1, wherein said nonlinear element has at least two films electrically connected with said ferroelectric film and having such a characteristic that the quantity of increase of a positive electric flux density D with respect to an electric field E is small in a low electric field region and large in a high electric field region in a dependency of the electric field density D and the electric field E or such a characteristic that the quantity of increase of a positive current I is small in a low electric field or low voltage region and large in a high electric field or high voltage region in a dependency of the current I and the electric field E or an applied voltage.

8. The nonvolatile semiconductor memory device according to claim 1, further comprising an insulated gate field-effect transistor and a capacitor electrically connected with one of a pair of source/drain regions of said insulated gate field-effect transistor, wherein
    said ferroelectric film and said nonlinear element are held between a pair of electrodes included in said capacitor.

9. The nonvolatile semiconductor memory device according to claim 1, further comprising an insulated gate field-effect transistor, wherein
    said ferroelectric film and said nonlinear element are held between a region held between a pair of source/drain regions of said insulated gate field-effect transistor and a control gate electrode.

10. The nonvolatile semiconductor memory device according to claim 1, further comprising an insulated gate field-effect transistor, wherein
    said insulated gate field-effect transistor has a pair of source/drain regions as well as a floating gate electrode and a control gate electrode formed on a region held between said pair of source/drain regions, and
    said ferroelectric film and said nonlinear element are held between said control gate electrode and said floating gate electrode.

* * * * *